US012787622B2

(12) United States Patent
Fan et al.

(10) Patent No.: US 12,787,622 B2
(45) Date of Patent: Nov. 3, 2026

(54) DISPLAY PANEL INCLUDING BARRIER STRUCTURE AND DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Cong Fan, Beijing (CN); Ming Hu, Beijing (CN); Kemeng Tong, Beijing (CN); Xiangdan Dong, Beijing (CN); Fan He, Beijing (CN); Rong Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 703 days.

(21) Appl. No.: 18/250,586

(22) PCT Filed: May 31, 2022

(86) PCT No.: PCT/CN2022/096347

§ 371 (c)(1),
(2) Date: Apr. 26, 2023

(87) PCT Pub. No.: WO2023/230877

PCT Pub. Date: Dec. 7, 2023

(65) Prior Publication Data

US 2024/0389443 A1 Nov. 21, 2024

(51) Int. Cl.

| | |
|---|---|
| ***H10K 59/88*** | (2023.01) |
| *G02F 1/1333* | (2006.01) |
| *G02F 1/1339* | (2006.01) |

(52) U.S. Cl.

CPC ....... *H10K 59/88* (2023.02); *G02F 1/133388* (2021.01); *G02F 1/1339* (2013.01); *G02F 2201/54* (2013.01)

(58) Field of Classification Search

CPC ............. G02F 1/1339; G02F 1/133388; G02F 2201/54

See application file for complete search history.

(56) References Cited

U.S. PATENT DOCUMENTS

| | | | |
|---|---|---|---|
| 2015/0261030 | A1 | 9/2015 | Chen et al. |
| 2017/0069873 | A1 | 3/2017 | Kim et al. |

(Continued)

FOREIGN PATENT DOCUMENTS

| | | | |
|---|---|---|---|
| CN | 108281570 | A | 7/2018 |
| CN | 111081736 | A | 4/2020 |

(Continued)

OTHER PUBLICATIONS

Chinese First Office Action (with English for corresponding Chinese Application No. CN202280001607.4, dated May 1, 2025, 20 pages.

*Primary Examiner* — Paisley L Wilson
(74) *Attorney, Agent, or Firm* — Dority & Manning, P.A.

(57) ABSTRACT

A display panel has a display area and a peripheral area including side peripheral areas and corner peripheral areas. The display panel includes a first barrier structure. The first barrier structure is in the peripheral area and at least partially surrounds the display area. The first barrier structure includes a first portion and a second portion. The first portion is in a side peripheral area and including M first barriers, M≥2. The second portion is in a corner peripheral area and including N second barriers, N≥1. M>N. A first dimension of the first portion is greater than a second dimension of the second portion, the first dimension is a dimension of the first portion in a direction perpendicular to its extending direc- (Continued)

tion, and the second dimension is a dimension of the second portion in a direction perpendicular to its extending direction.

18 Claims, 13 Drawing Sheets

(56) References Cited

U.S. PATENT DOCUMENTS

| | | | |
|---|---|---|---|
| 2020/0220097 | A1 | 7/2020 | Song et al. |
| 2021/0226162 | A1 | 7/2021 | Qian et al. |
| 2021/0266162 | A1 | 8/2021 | Murdoch et al. |
| 2022/0085330 | A1 | 3/2022 | Yang et al. |
| 2022/0102462 | A1 | 3/2022 | Zhou et al. |
| 2023/0049009 | A1 | 2/2023 | Wu et al. |

FOREIGN PATENT DOCUMENTS

| | | | | | |
|---|---|---|---|---|---|
| CN | 111146211 | A | | 5/2020 | |
| CN | 112764256 | A | * | 5/2021 | ....... G02F 1/133388 |
| CN | 113363298 | A | | 9/2021 | |
| CN | 113451526 | A | | 9/2021 | |
| CN | 113470530 | A | | 10/2021 | |

* cited by examiner

DISPLAY PANEL INCLUDING BARRIER STRUCTURE AND DISPLAY APPARATUS

CROSS-REFERENCE TO RELATED APPLICATION

This application is a national phase entry under 35 USC 371 of International Patent Application No. PCT/CN2022/096347 filed on May 31, 2022, which is incorporated herein by reference in its entirety.

TECHNICAL FIELD

The present disclosure relates to the field of display technologies, and in particular, to a display panel and a display apparatus.

BACKGROUND

At present, organic light-emitting diode (OLED for short) display apparatuses have been widely used due to their properties such as self-luminescence, fast response, wide viewing angle, and the fact that the display apparatuses are capable of being fabricated on flexible substrates. The OLED display apparatus with a full-screen can enable users to get good viewing experience due to a high screen-to-body ratio, and attracts a large number of users.

SUMMARY

In an aspect, a display panel is provided. The display panel has a display area and a peripheral area surrounding the display area. The peripheral area includes a plurality of side peripheral areas and a plurality of corner peripheral areas, and two adjacent side peripheral areas are connected to a corner peripheral area therebetween. The display panel includes a first barrier structure. The first barrier structure is disposed in the peripheral area and at least partially surrounds the display area. The first barrier structure is configured to prevent a crack in the peripheral area from extending to the display area. The first barrier structure includes a first portion and a second portion. The first portion is located in a side peripheral area and includes M first barriers extending along the side peripheral area, M is greater than or equal to 2 (M≥2). The second portion is located in a corner peripheral area and includes N second barriers extending along the corner peripheral area, N is greater than or equal to 1 (N≥1). M is greater than N (M>N). A first dimension of the first portion is greater than a second dimension of the second portion, the first dimension is a dimension of the first portion in a direction perpendicular to an extending direction of the first portion, and the second dimension is a dimension of the second portion in a direction perpendicular to an extending direction of the second portion.

In some embodiments, at least one of the N second barriers is connected to at least two of the M first barriers.

In some embodiments, the second portion includes at least two second barriers. In a direction away from the display area, an outermost first barrier is connected to an outermost second barrier, and remaining M−1 first barriers are connected to remaining N−1 second barriers.

In some embodiments, M is equal to 5 (M=5), and N is equal to 2 (N=2). In a direction away from the display area, an outermost first barrier is connected to an outermost second barrier, and remaining M−1 first barriers are connected to remaining N−1 second barriers.

In some embodiments, the M first barriers are spaced an equal distance apart; and/or N is greater than or equal to 2 (N≥2), and the N second barriers are spaced an equal distance apart; and/or widths of the M first barriers are substantially equal; and/or N is greater than or equal to 2 (N≥2), and widths of the N second barriers are substantially equal.

In some embodiments, the widths of the M first barriers are substantially equal, and the widths of the first barriers and the widths of the second barriers are substantially equal; and/or the M first barriers are spaced the equal distance apart, N is greater than or equal to 2 (N≥2), N second barriers are spaced the equal distance apart, and the distance between two adjacent first barriers is equal to the distance between two adjacent second barriers.

In some embodiments, the peripheral area further includes a plurality of transition peripheral areas. Aside peripheral area and a corner peripheral area that are adjacent are connected through a transition peripheral area therebetween. A junction of the transition peripheral area and the corner peripheral area forms an inward concave shape, and the inward concave shape is sunken towards a direction proximate to the display area.

In some embodiments, a width of the transition peripheral area decreases from an end, connected to the side peripheral area, of the transition peripheral area to an end, connected to the corner peripheral area, of the transition peripheral area. At least one second barrier of the N second barriers is connected to at least two first barriers of the M first barriers, and junctions of the at least two first barriers and the at least one second barrier are located in the transition peripheral area.

In some embodiments, the display panel further includes a substrate and a first insulating stacked layer. The first insulating stacked is disposed on the substrate. A surface of the first insulating stacked layer away from the substrate is provided with a plurality of grooves therein, and the plurality of grooves are located in the peripheral area, and at least partially surround the display area. In a direction away from the display area, the plurality of grooves are sequentially arranged at intervals. Portions, located between two adjacent grooves, of the first insulating stacked layer form a first barrier and a second barrier.

In some embodiments, the first insulating stacked layer includes a buffer layer, a first gate insulating layer, a second gate insulating layer, an interlayer dielectric layer, and a passivation layer that are sequentially arranged in a direction perpendicular to the substrate and away from the substrate. The grooves penetrate through at least one, relatively away from the substrate, of the buffer layer, the first gate insulating layer, the second gate insulating layer, the interlayer dielectric layer and the passivation layer.

In some embodiments, the display panel further includes: a filling part. The filling part fills the grooves and covers the first barriers and the second barriers.

In some embodiments, the display panel further includes a planarization layer. The planarization layer is disposed on a side of the first insulating stacked layer away from the substrate. The filling part and the planarization layer are made of a same material and are disposed in a same layer.

In some embodiments, the display panel further includes an encapsulation layer. The encapsulation layer is disposed on a side of the first insulating stacked layer away from the substrate and includes a first inorganic encapsulation layer, an organic encapsulation layer and a second inorganic encapsulation layer that are sequentially arranged in a direction perpendicular to the substrate and away from the substrate. The first inorganic encapsulation layer and the second inorganic encapsulation layer cover the first barrier structure, and an orthographic projection of the organic encapsulation layer on the substrate and an orthographic projection of the first barrier structure on the substrate have a distance therebetween.

In some embodiments, the display panel further includes a second barrier structure. The second barrier structure is disposed between the first barrier structure and the display area and surrounds the display area. The second barrier structure is configured to prevent a material in the display area from overflowing. A third dimension of a portion, located in the side peripheral area, of the second barrier structure is greater than a fourth dimension of a portion, located in the corner peripheral area, of the second barrier structure. The third dimension is a dimension of the portion, located in the side peripheral area, of the second barrier structure in a direction perpendicular to an extending direction of the portion, and the fourth dimension is a dimension of the portion, located in the corner peripheral area, of the second barrier structure in a direction perpendicular to an extending direction of the portion.

In some embodiments, the second barrier structure includes at least one third barrier, the at least one third barrier surrounds the display area. In a case that the second barrier structure includes one third barrier, a width of a portion, located in the side peripheral area, of the third barrier is greater than a width of a portion, located in the corner peripheral area, of the third barrier.

In a case that the second barrier structure includes at least two third barriers, the at least two third barriers are sequentially arranged at intervals in a direction away from the display area. In the side peripheral area, a distance between two adjacent third barriers is a first distance; in the corner peripheral area, a distance between the two adjacent third barriers is a second distance; and the first distance is greater than the second distance; and/or a width of a portion, located in the side peripheral area, of a third barrier is greater than a width of a portion, located in the corner peripheral area, of the third barrier.

In another aspect, another display panel is provided. The display panel has a display area and a peripheral area surrounding the display area. The peripheral area includes a plurality of side peripheral areas and a plurality of corner peripheral areas, and two adjacent side peripheral areas are connected to a corner peripheral area therebetween. The display panel includes a second barrier structure surrounding the display area. The second barrier structure is configured to prevent a material in the display area from overflowing. A third dimension of a portion, located in a side peripheral area, of the second barrier structure, is greater than a fourth dimension of a portion, located in a corner peripheral area, of the second barrier structure. The third dimension is a dimension of the portion, located in the side peripheral area, of the second barrier structure in a direction perpendicular to an extending direction of the portion, and the fourth dimension is a dimension of the portion, located in the corner peripheral area, of the second barrier structure in a direction perpendicular to an extending direction of the portion.

In some embodiments, the second barrier structure includes at least one third barrier, the at least one third barrier surrounds the display area. In a case that the second barrier structure includes one third barrier, a width of a portion, located in the side peripheral area, of the third barrier is greater than a width of a portion, located in the corner peripheral area, of the third barrier.

In a case that the in a case that the second barrier structure includes at least two third barriers, the at least two third barriers are sequentially arranged at intervals in a direction away from the display area; in the side peripheral area, a distance between two adjacent third barriers is a first distance; in the corner peripheral area, a distance between the two adjacent third barriers is a second distance; and the first distance is greater than the second distance; and/or a width of a portion, located in the side peripheral area, of a third barrier is greater than a width of a portion, located in the corner peripheral area, of the third barrier.

In some embodiments, the third barrier includes a first barrier section, a second barrier section, and a third barrier section. The first barrier section extends along the side peripheral area. The second barrier section extends along the corner peripheral area. The third barrier section is connected between the first barrier section and the second barrier section. A width of the third barrier section decreases from an end, connected to the first barrier section, of the third barrier section to an end, connected to the second barrier section, of the third barrier section.

In some embodiments, the display panel further includes a substrate, and at least one planarization layer and a pixel defining layer that are sequentially disposed on the substrate. The third barrier includes at least one first pad layer and a second pad layer that are arranged in a direction perpendicular to the substrate; the at least one first pad layer is located in the at least one planarization layer, and the second pad layer is located in the pixel defining layer.

In some embodiments, the display panel includes a plurality of planarization layers. The third barrier includes a first supporting part and a second supporting part. The first supporting part includes a plurality of first pad layers, for any two adjacent first pad layers, an orthographic projection of a first pad layer relatively proximate to the substrate on the substrate is within a range of an orthographic projection of a first pad layer relatively away from the substrate on the substrate. The second supporting part is disposed on a side of the first supporting part away from the substrate and includes at least one first pad layer and the second pad layer, an orthographic projection of a first pad layer adjacent to the second pad layer on the substrate is within a range of an orthographic projection of the second pad layer on the substrate.

In some embodiments, an orthographic projection of the second supporting part on the substrate is within a range of an orthographic projection of the first supporting part on the substrate.

In some embodiments, the second barrier structure includes two third barriers; the two third barriers share the first supporting part, and orthographic projections of second supporting parts of the two third barriers on the substrate are both within a range of an orthographic projection of the first supporting part on the substrate.

In some embodiments, the second barrier structure includes two third barriers, and a number of first pad layers includes in a third barrier relatively away from the display area is greater than a number of first pad layers includes in a third barrier relatively proximate to the display area.

In some embodiments, the display area includes a transparent display area and a main display area at least partially surrounding the transparent display area. The display panel further includes first sub-pixels, and at least one transparent conductive layer. The first sub-pixels are disposed in the transparent display area. The at least one transparent conductive layer includes transparent signal lines located in the transparent display area, and the transparent signal lines are electrically connected to the first sub-pixels. A transparent conductive layer is disposed between two adjacent planarization layers.

In some embodiments, a height of a portion, located in the corner peripheral area, of the third barrier is less than a height of a portion, located in the side peripheral area, of the third barrier.

In some embodiments, the display panel further includes a spacer layer. The spacer layer is disposed on a side of the pixel defining layer away from the substrate. The third barrier further includes a third pad layer, in the side peripheral area, disposed on a side of the second pad layer away from the substrate, and the third pad layer is located in the spacer layer.

In yet another aspect, a display apparatus is provided. The display apparatus includes the display panel according to the above embodiments.

BRIEF DESCRIPTION OF THE DRAWINGS

In order to describe technical solutions in some embodiments of the present disclosure more clearly, the accompanying drawings to be used in some embodiments of the present disclosure will be introduced briefly; obviously, the accompanying drawings to be described below are merely some embodiments of the present disclosure, and a person of ordinary skill in the art can obtain other drawings according to those drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1:
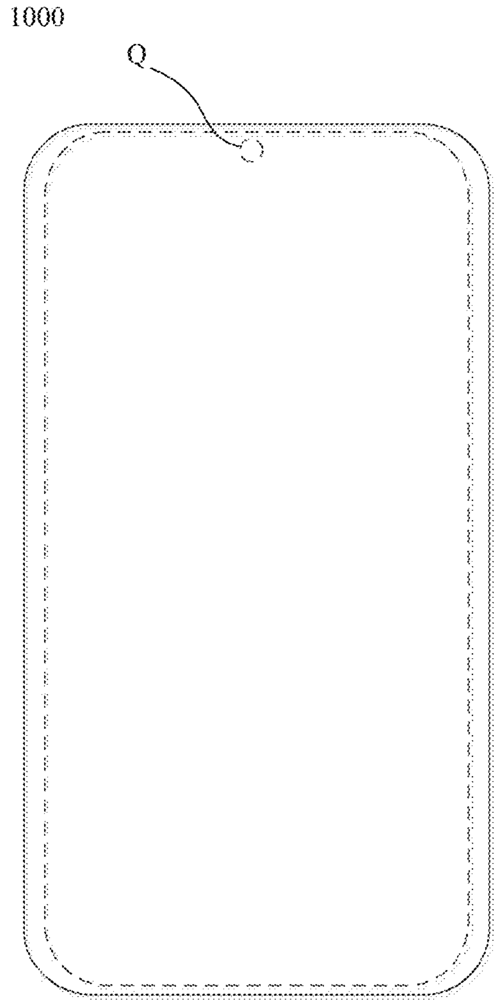
FIG. 1 is a structural diagram of a display apparatus, in accordance with some embodiments.

The technical solutions in embodiments of the present disclosure will be described clearly and completely with reference to the accompanying drawings. Obviously, the described embodiments are merely some but not all of embodiments of the present disclosure. All other embodiments obtained by a person having ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed in an open and inclusive sense, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, the features defined with "first" and "second" may explicitly or implicitly include one or more of the features. In the description of the embodiments of the present disclosure, the term "a plurality of/the plurality of" means two or more unless otherwise specified.

The phrase "A and/or B" includes the following three combinations: only A, only B, and a combination of A and B.

The phrase "applicable to" or "configured to" used herein has an open and inclusive meaning, which does not exclude devices that are applicable to or configured to perform additional tasks or steps.

In addition, the use of the phrase "based on" means openness and inclusiveness, since processes, steps, calculations or other actions "based on" one or more of the stated conditions or values may, in practice, be based on additional conditions or values exceeding those stated.

The term such as "substantially" as used herein includes a stated value and an average value within an acceptable range of deviation of a particular value determined by a person of ordinary skill in the art, considering measurement in question and errors associated with measurement of a particular quantity (i.e., limitations of a measurement system).

The term such as "perpendicular" or "equal" as used herein includes a stated case and a case similar to the stated case within an acceptable range of deviation determined by a person of ordinary skill in the art, considering measurement in question and errors associated with measurement of a particular quantity (i.e., limitations of a measurement system). For example, the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be a difference between two equals being less than or equal to 5% of either of the two equals.

It will be understood that, in a case that a layer or element is referred to be on another layer or substrate, it may be that the layer or element is directly on the another layer or substrate, or it may be that there is an intermediate layer between the layer or element and the another layer or substrate.

Exemplary embodiments are described herein with reference to sectional views and/or plan views as idealized exemplary drawings. In the accompanying drawings, thicknesses of layers and areas of regions (areas) are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

It will be noted that the embodiments and features of the embodiments in the present disclosure may be combined with each other without conflict. Hereinafter, the present disclosure will be described in detail with reference to the accompanying drawings by combining the embodiments.

Some embodiments of the present disclosure provide a display apparatus. The display apparatus may be any apparatus having a display function, such as a tablet computer, a monitor, a mobile phone or a personal digital assistant (PDA for short). For example, as shown in FIG. 11, a display apparatus 1000 provided by some embodiments of the present disclosure is a full-screen smartphone.

Embodiments of the present disclosure do not limit a specific type of the display apparatus 1000. For example, the display apparatus 1000 may be an organic electroluminescent diode (organic light-emitting diode, OLED for short) display apparatus, or a quantum dot electroluminescent diode (quantum dot light-emitting diode, QLED for short) display apparatus, or an active matrix organic light-emitting diode (AMOLED for short) display apparatus. The following embodiments will be described in detail by taking an example in which the display apparatus is an AMOLED display apparatus.

With the rapid promotion and widespread use of AMOLED display apparatuses, AMOLED display apparatuses with a full-screen can enable users to get good viewing experience due to high screen-to-body ratio thereof, and attract a large number of consumers. The AMOLED display apparatus with a full-screen includes an AMOLED display panel and a rear shell. The embodiments of the present disclosure are all described by taking an example in which a display panel 1100 is an AMOLED display panel to illustrate the present disclosure.

Generally, a shape of the display panel is approximately rectangular, upper and lower sides of the display panel are not bent, and only left and right sides of the display panel are bent at a large angle and connected to edges of the rear shell to form a commonly-called waterfall screen, so that an area for displaying images is increased. It can be understood that "upper and lower" and "left and right" herein refer to that during the use of the display apparatus for displaying images, two opposite sides of the display panel are bent, and the other two opposite sides are not bent. Alternatively, the left and right sides of the display panel are not be bent, and only the upper and lower sides are bent at a large angle.

As another example, the shape of the display panel is approximately rectangular, and four sides of the display panel are bent at a large angle and connected to edges of the rear shell, so that the area for displaying images is further increased, and the screen-to-body ratio is improved. In a case that the four sides of the display panel are bent at the large angle, an arrangement manner of an under-screen camera may be adopted, which will not influence the effect of the display panel displaying image and the area of the displayed images, and improve the user's experience.

However, in the case that the four sides of the display panel are bent at the large angle, film layers at an intersection (corner) of any two adjacent sides of the four sides are stacked, and a thickness of the film layers stacked at the corner is increased by 2 to 3 times compared with a thickness of film layers at the non-intersection. As a result, the film layers at the corner are folded due to stacking, which is likely to cause wrinkle or delamination of film layers in the area where the image is displayed, thereby reducing the yield of the display panel and causing poor display effect of the display panel.

Figure 2:
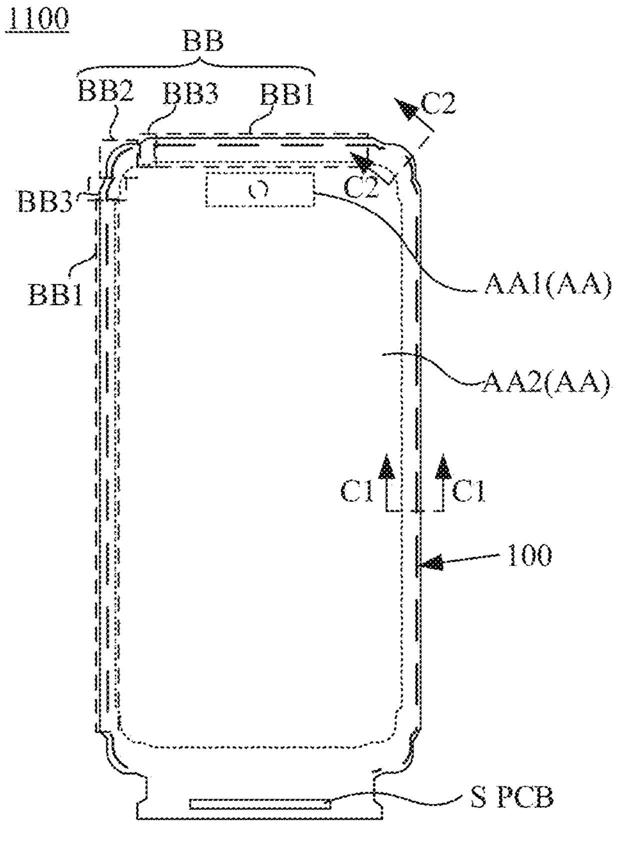
FIG. 2 is a structural diagram of a display panel, in accordance with some embodiments.

In order to solve the above problems, as shown in FIG. 2, embodiments of the present disclosure provide a display panel 1100. The display panel 1100 includes a display area AA (active area, AA for short, also being referred as an active display area) and a peripheral area BB surrounding the display area AA.

In the embodiments of the present disclosure, a structure of the peripheral area BB is improved to reduce the probability of stacking the film layers at the intersection (corner) of any two adjacent sides of the four sides. As shown in FIG. 2, the peripheral area BB includes a plurality of side peripheral areas BB1 and a plurality of corner peripheral areas BB2, and two adjacent side peripheral areas BB1 are connected to a corner peripheral area BB2 therebetween.

In some examples, with continued reference to FIG. 2, the peripheral area BB further includes a plurality of transition peripheral areas BB3. A side peripheral area BB1 and a corner peripheral area BB2 that are adjacent are connected through a transition peripheral area BB3 therebetween. A junction of the transition peripheral area BB3 and the corner peripheral area BB2 forms an inward concave shape, and the inward concave shape is sunken towards a direction proximate to the display area AA. In this way, during bending of the peripheral area BB, since the concave shape is beneficial to reduce an overlapping thickness of film layers in the side peripheral area BB1 and the corner peripheral area BB2 on a non-display side, the bending of the peripheral area BB is facilitated.

For example, as shown in FIG. 2, a width of the transition peripheral area BB3 gradually decreases from an end, connected to the side peripheral area BB1, of the transition peripheral area BB3 to an end, connected to the corner peripheral area BB2, of the transition peripheral area BB3. In this way, in a case that a size of the side peripheral area BB1 satisfies an arrangement space of various types of function devices, the corner peripheral area BB2 is made narrower. In a case that the four side edges of the display panel 1100 are bent at a large angle, the film layers in the corner peripheral area BB2 have a low probability of being stacked, so that the probability of wrinkle or delamination of the film layers in the display area is reduced, and the yield of the display panel is improved.

Figure 3:
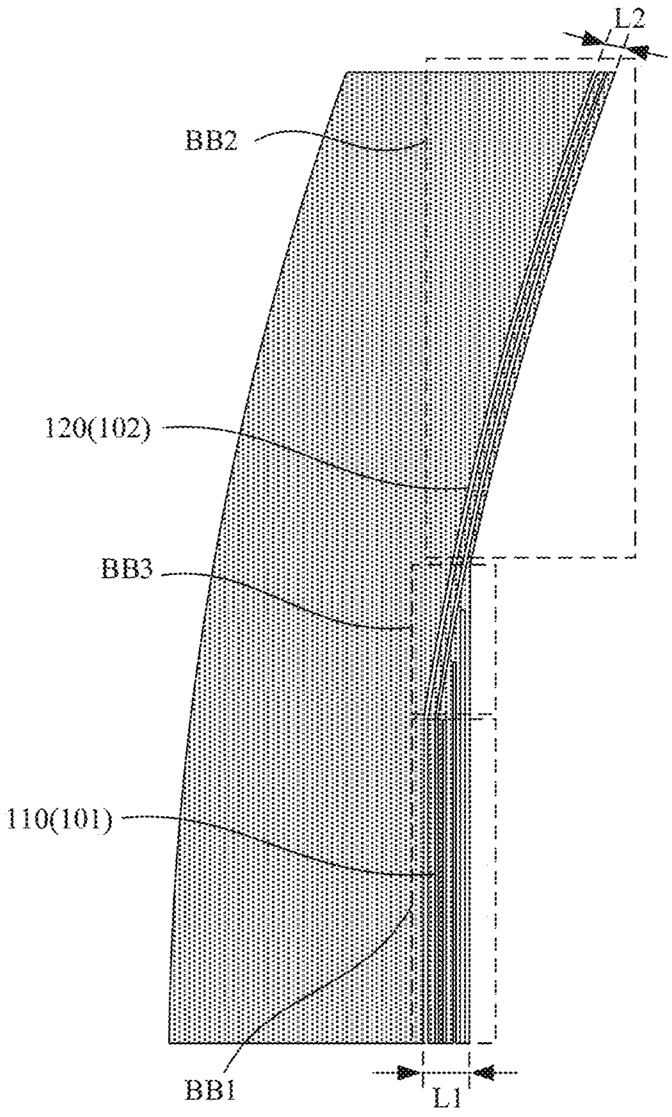
FIG. 3 is a partial structural diagram of a first barrier structure of a display panel, in accordance with some embodiments.

In some embodiments, as shown in FIGS. 2 and 3, the peripheral area BB is provided with the first barrier structure 100. The first barrier structure 100 is disposed in the peripheral area BB and at least partially surrounds the display area AA.

It can be understood that the first barrier structure 100 is disposed in the peripheral area BB and at least partially surrounds the display area a, which means that based on a configuration of one side peripheral area BB1 of the display panel 1100 for arranging electronic components electrically connected to a driving circuit board S PCB, this side peripheral area BB1 is not provided with the first barrier structure 100 to leave enough space, so that the first barrier structure 100 extends from a left side peripheral area to a right side peripheral area of the display panel 1100 through an upper side peripheral area to form a structure surrounding the display area AA on three sides. Respective portions of the first barrier structure 100 are disposed in four corner peripheral areas BB2 of the display panel 1100, and the respective portions of the first barrier structure 100 in the four corner peripheral areas BB2 are equal.

The first barrier structure 100 is configured to prevent a crack in the peripheral area BB from extending to the display area AA. In general, during a process of cutting the display panel 1100, the crack may be generated due to a thin thickness of the display panel 1100, and a structure and material of the first barrier structure 100 are advantageous to prevent the crack from extending.

In some examples, as shown in FIG. 3, the first barrier structure 100 includes a first portion 101 and a second portion 102. A first dimension L1 of the first portion 101 is greater than a second dimension L2 of the second portion 102. The first dimension L1 is a dimension of the first portion 101 in a direction perpendicular to its extending direction. The second dimension L2 is a dimension of the second portion 102 in a direction perpendicular to its extending direction.

Figure 4:
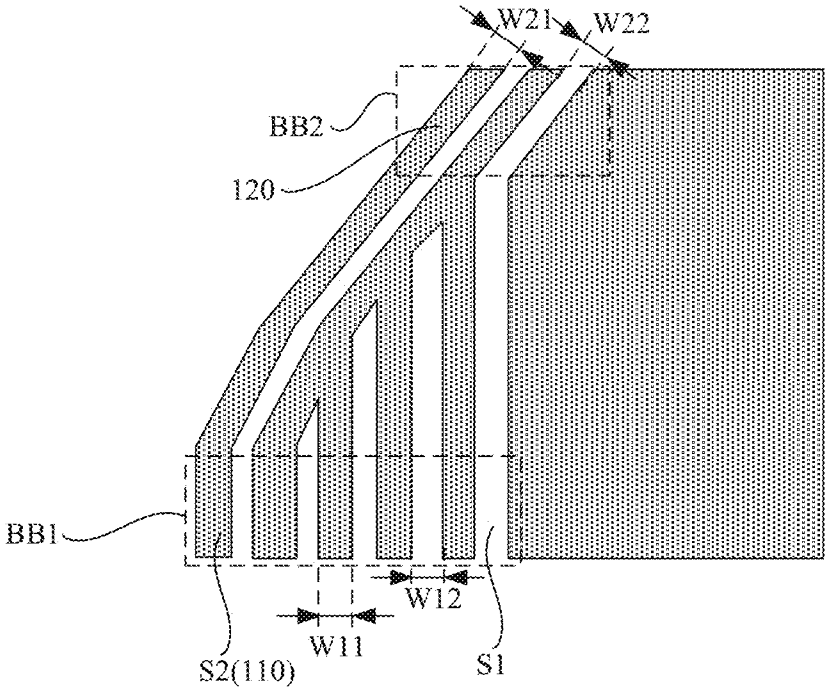
FIG. 4 is a partial structural diagram of a first barrier structure, in accordance with some embodiments.

As shown in FIG. 4, the first portion 101 is located in a side peripheral area BB1, and the first portion 101 includes first barriers 110; and the second portion 102 is located in a corner peripheral area BB2, and the second portion 102 includes second barriers 120. As shown in FIG. 4, the first portion 101 includes M first barriers 110 extending along the side peripheral area BB1, where M is greater than or equal to 2 ($M \geq 2$); the second portion 102 includes N second barriers 120 extending along the corner peripheral area BB2, where N is greater than or equal to 1 ($N \geq 1$). M is greater than N ($M>N$).

The number of the first barriers 110 in the first portion 101 is greater than the number of the second barriers 120 in the second portion 102, and the first dimension L1 of the first portion 101 is greater than the second dimension L2 of the second portion 102, so that of the display panel 1100 cut along a side of the first barrier structure 100 away from the display area AA at an equal interval, a total width of the corner peripheral areas BB2 is less than a total width of the side peripheral areas BB1. Thus, in a case that the peripheral area BB of the display panel 1100 is bent, there exists a low probability of an occurrence of wrinkles in a portion, bent to the non-display side of the display panel 1100, of the corner peripheral area BB2, and a thickness of stacked film layers at the bent portion of the corner peripheral area BB2 is small, which may reduce the probability of the poor display effect of the display panel 1100 caused by the wrinkles generated by bending the corner peripheral area BB2.

In some embodiments, as shown in FIG. 4, at least one of the N second barriers 120 is connected to at least two of the M first barriers 110.

Thus, in a case of $M>N$, the second barrier 120 in the corner peripheral area BB2 and some of the first barriers 110 in the side peripheral area BB1 can be connected to form at least one continuous structure surrounding three sides of the display area AA, and such first barrier structure 100 may protect the display area AA from multiple directions surrounding the display area AA. And in a case that N first barriers 110 are connected to the N second barriers 120, at least one of the remaining M-N first barriers 110 is connected to the second barrier 120 again, so as to improve the rigidity of the first barrier structure 100, and further reduce the probability that the crack on the side of the first barrier structure 100 away from the display area AA extends to the display area AA.

In some examples, as shown in FIG. 4, the second portion 102 includes at least two barriers 120. In a direction away from the display area AA, an outermost first barrier 110 is connected to an outermost second barrier 120, and the remaining M−1 first barriers 110 are connected to the remaining N−1 second barriers 120, where $M>N$.

For example, in a case that the second portion 102 includes the at least two second barriers 120, the two second barriers 120 and the first barriers 110 form two continuous structures surrounding the three sides of the display area AA, which is beneficial to reducing the probability that the crack on the side of the corner peripheral area BB2 away from the display area AA extends to the display area AA during the formation of the corner peripheral area BB2.

In some embodiments, as shown in FIG. 4, $M=5$ and $N=2$. In the direction away from the display area AA, the outermost first barrier 110 is connected to the outermost second barrier 120, and the remaining four first barriers 110 are connected to the remaining one second barrier 120.

For example, with continued reference to FIG. 4, in the direction away from the display area AA, two outermost first barriers 110 are respectively connected to two second barriers 120 to form two continuous structures surrounding the three sides of the display area AA, which is favorable for improving the rigidity of the first barrier structure 100; the remaining three first barriers 110 are connected to an innermost second barrier 120.

Alternatively, in the direction away from the display area AA, an outermost first barrier 110 is connected to an outermost second barrier 120, an innermost first barrier is connected to an innermost second barrier 120, and the remaining three first barriers 110 are not connected to the second barriers 120.

It can be understood that, in a case that the N second barriers 120 and the N first barriers 110 form N independent structures, the remaining M-N first barriers 110 may not be connected to any one of the N second barriers 120.

The junction of the first barrier 110 and the second barrier 120 is located in the transition peripheral area BB3. Since the number of the N second barriers 120 is less than the number of the M first barriers 110, at least one of the N second barriers 120 is connected to at least two of the M first barriers 110 in the transition peripheral area BB3. Further, the width of the transition peripheral area BB3 gradually decreases from the end, connected to the side peripheral area BB1, of the transition peripheral area BB3 to the end, connected to the corner peripheral area BB2, of the transition peripheral area BB3.

In some embodiments, as shown in FIG. 4, the M first barriers 110 are spaced an equal distance apart; and/or N is greater than or equal to 2 (N≥2), and the N second barriers 120 are spaced an equal distance apart; and/or widths of the M first barriers 110 are substantially equal; and/or N is greater than or equal to 2 (N=2), and widths of the N second barriers 120 are substantially equal. Thus, the first barriers 110 are uniformly distributed, which is beneficial to process implementation.

In some examples, the M first barriers 110 are spaced the equal distance apart. For example, the distance W12 between two adjacent first barriers 110 is in a range of 4 μm to 6 μm, inclusive. For example, the distance W12 between two adjacent first barriers 110 is 4 μm, or 5 μm, or 6 μm. For example, the distance W12 between two adjacent first barriers 110 is 6 μm.

In some examples, the widths W11 of the M first barriers 110 are substantially equal. For example, a width of each first barrier 110 is in a range of 4 μm to 6 μm, inclusive. For example, the width of each first barrier 110 is 4 μm, or 5 μm, or 6 μm. For example, the width of each first barrier 110 is 6 μm.

In some examples, N≥2, the N second barriers 120 are spaced the equal distance apart. For example, the distance W22 between two adjacent second barriers 120 is in a range of 4 μm to 6 μm, inclusive. For example, the distance W22 between two adjacent second barriers 120 is 4 μm, or 5 μm, or 6 μm. For example, the distance W22 between two adjacent second barriers 120 is 4 μm.

In some examples, N≥2, the widths W21 of the N second barriers 120 are substantially equal. For example, a width of each second barrier 120 is in a range of 4 μm to 6 μm, inclusive. For example, the width of each second barrier 120 is 4 μm, or 5 μm, or 6 μm. For example, the width of each second barrier 120 is 4 μm.

In the foregoing examples, embodiments obtained by any combination (two, three or four examples) falls within the protection scope of the present disclosure, and the present disclosure is not limited specifically herein.

In some embodiments, as shown in FIG. 4, the widths W11 of the M first barriers 110 are substantially equal, and the widths W11 of the first barriers 110 are substantially equal to the widths W21 of the second barriers 120; and/or the M first barriers 110 are spaced the equal distance apart W12, N≥2, the N second barriers 120 are spaced the equal distance apart W22, and the distance W12 between two adjacent first barriers 110 is substantially equal to the distance W22 between two adjacent second barriers 120.

In some examples, the widths W11 of the M first barriers 110 are substantially equal, and the widths W11 of the first barriers 110 and the widths W21 of the second barriers 120 are substantially equal. For example, the width W11 of each first barrier 110 is 4 μm to 6 μm. For example, the width W11 of each first barrier 110 is 6 μm, and the width W21 of each second barrier 120 is 6 μm.

In some other examples, the M first barriers 110 are spaced the equal distance W12 apart, N≥2, the N second barriers 120 are spaced the equal distance W22 apart, and the distance W12 between two adjacent first barriers 110 is substantially equal to the distance W22 between two adjacent second barriers 120. For example, the distance W12 between two adjacent first barriers 110 is 4 μm to 6 μm. For example, the distance W12 between two adjacent first barriers 110 is 5 μm, and the distance W22 between two adjacent second barriers 120 is 5 μm.

In yet some other examples, the widths W11 of the M first barriers 110 are substantially equal, and the widths W11 of the first barriers 110 are substantially equal to the widths W21 of the second barriers 120; and the M first barriers 110 are spaced the equal distance. N≥2, the N second barriers 120 are spaced the equal distance W22 apart, and the distance W12 between two adjacent first barriers 110 is substantially equal to the distance W22 between two adjacent second barriers 120.

For example, the distance W12 between two adjacent first barriers 110 is 4 μm to 6 μm. For example, the distance W12 between two adjacent first barriers 110 is 5 μm, and the distance W22 between two adjacent second barriers 120 is 5 μm. The width W11 of each first barrier 110 is 4 μm to 6 μm. For example, the width W11 of each first barrier 110 is 6 μm, and the width W21 of each second barrier 120 is 6 μm.

Figure 5:
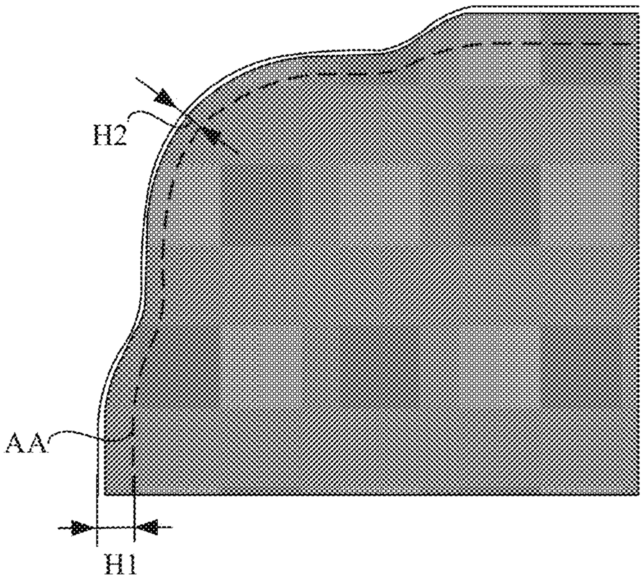
FIG. 5 is a partial structural diagram of a display panel, in accordance with some embodiments.

In combination with any combination of the above examples, referring to FIG. 5, a width H1 of the side peripheral area BB1 is 1.2 mm, and a width H2 of the corner peripheral area BB2 is 0.7 mm. A width of the transition peripheral area BB3 gradually decreases from 1.2 mm to 0.7 mm. As shown in FIG. 4, in the first barrier structure 100, the number M of the first barriers 110 is five, and the number N of the second barriers 120 is two. The width of the first barrier 110 is 6 μm, and the distance between two adjacent first barriers 110 is 6 μm; the width of each second barrier 120 is 5 μm, and the distance between two adjacent second barriers 120 is 5 μm. Thus, of the first barrier structure 100, the first dimension L1 is 60 μm, and the second dimension L2 is 20 μm.

Figure 6A:
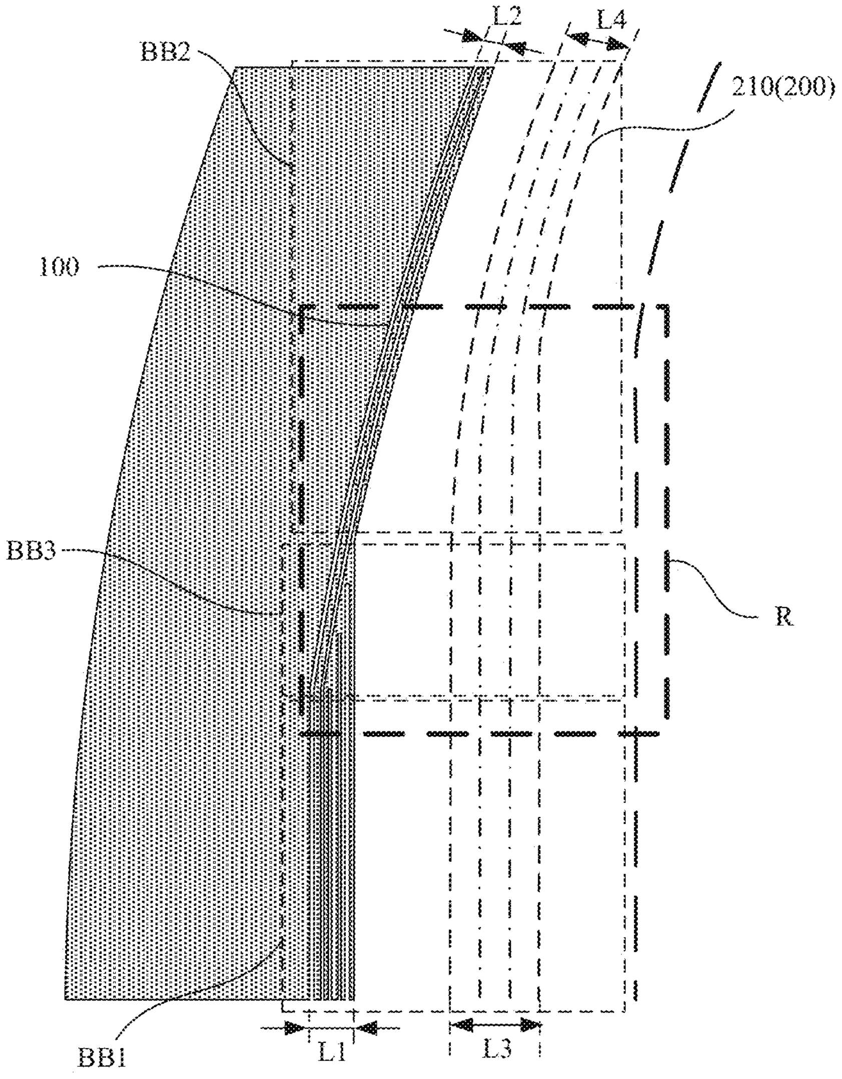
FIG. 6A is a partial structural diagram of a first barrier structure and a second barrier structure, in accordance with some embodiments.
Figure 6B:
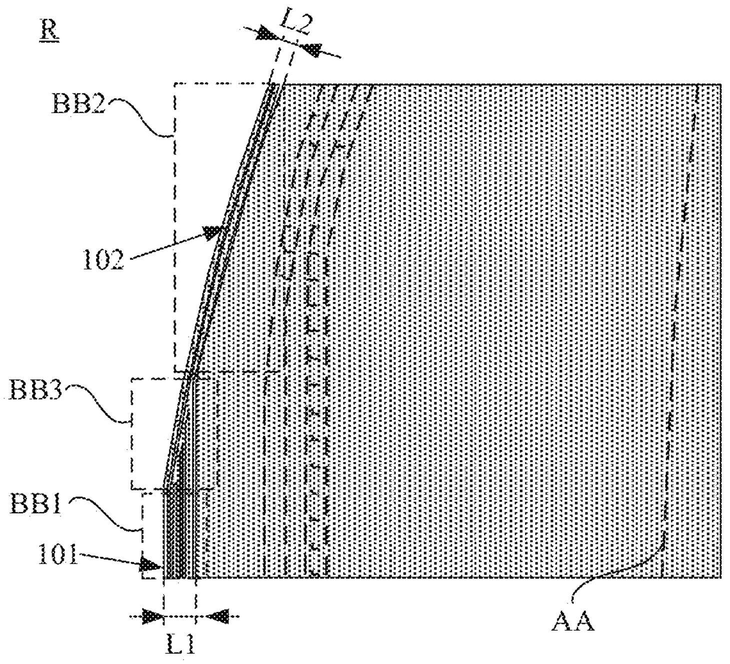
FIG. 6B is a partial enlarged view of the region R in FIG. 6A.

In some embodiments, as shown in FIGS. 6A and 6B, the peripheral area BB is further provided with a second barrier structure 200. The second barrier structure 200 is disposed between the first barrier structure 100 and the display area AA, and surrounds the display area AA. The second barrier structure 200 is configured to prevent a material in the display area AA from overflowing. It can be understood that the second barrier structure 200 is configured to prevent a material of an organic encapsulation layer in an encapsulation layer from overflowing onto signal lines in the peripheral area BB. Since the material of the organic encapsulation layer easily absorbs water and oxygen, the performance of the display panel 1100 is improved by reducing the probability that the material of the organic encapsulation layer contacts the signal lines in the peripheral area BB.

In some embodiments, as shown in FIGS. 6A and 6B, a third dimension L3 of a portion, located in the side peripheral area BB1, of the second barrier structure 200 is greater than a fourth dimension L4 of a portion, located in the corner peripheral area BB2, of the second barrier structure 200. The third dimension L3 is a dimension of the portion, located in the side peripheral area BB1, of the second barrier structure 200 in a direction perpendicular to its extending direction. That is, of the portion, located in the side peripheral area BB1, of the second barrier structure 200, the third dimension L3 is a distance between a side proximate to the display area AA and a side away from the display area AA. The fourth dimension L4 is a dimension of the portion, located in the corner peripheral area BB2, of the second barrier structure 200 in a direction perpendicular to its extending direction. That is, of the portion, located in the corner peripheral area BB2, of the second barrier structure 200, the fourth dimension L4 is a distance between a side proximate to the display area AA and a side away from the display area AA.

In this way, the fourth dimension L4 of the portion, located in the corner peripheral area BB2, of the second barrier structure 200 is set to be less than the third dimension L3 of the portion, located in the side peripheral area BB1, of the second barrier structure 200, so that in a case that the peripheral area BB of the display panel 1100 is bent, the probability of the portion of the corner peripheral area BB2 bent to the non-display side of the display panel 1100 being wrinkled is small and the thickness of the stacked film layers is small, thereby reducing the probability of poor display effect caused by the wrinkling of the corner peripheral area BB2 of the display panel 1100 due to bending.

In some embodiments, as shown in FIGS. 6A and 6B, the second barrier structure 200 includes at least one third barrier 210, and the third barrier 210 is disposed around the display area AA.

In some examples, in a case that the second barrier structure 200 includes one third barrier 210, a width W31 of a portion, located in the side peripheral area BB1, of the third barrier 210 is greater than a width W41 of a portion, located in the corner peripheral area BB2, of the third barrier 210.

Figure 7:
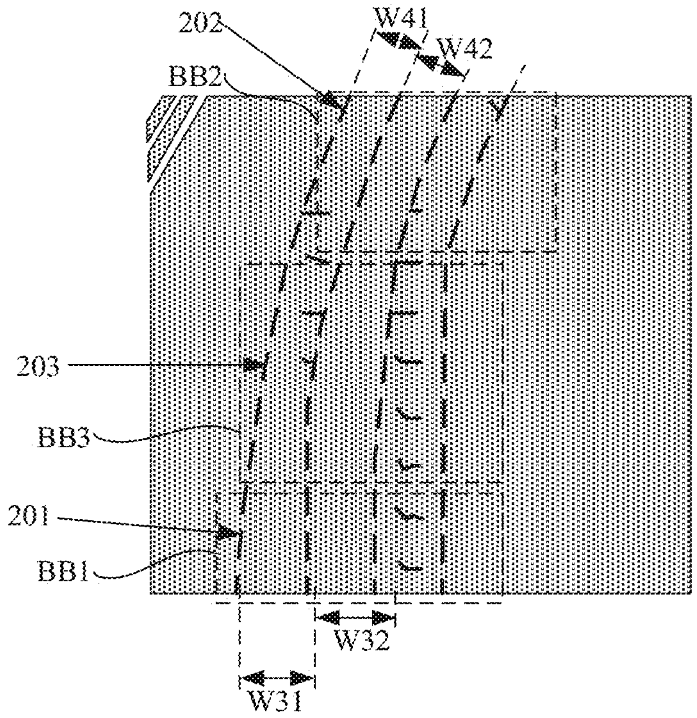
FIG. 7 is a partial structural diagram of a second barrier structure, in accordance with some embodiments.

In some examples, as shown in FIG. 7, in a case that the second barrier structure 200 includes at least two third barriers 210, the at least two third barriers 210 are sequentially arranged at intervals in a direction away from the display area AA. A width W31 of a portion, located in the side peripheral area BB1, of the third barrier 210 is greater than a width W41 of a portion, located in the corner peripheral area BB2, of the third barrier 210. And/or in the side peripheral area BB1, a distance between two adjacent third barriers 210 is a first distance W32; in the corner peripheral area BB2, a distance between the two adjacent third barriers 210 is a second distance W42; and the first distance W32 is greater than the second distance W42.

For example, a width W31 of a portion, located in the side peripheral area BB1, of the third barrier 210 is greater than a width W41 of a portion, located in the corner peripheral area BB2, of the third barrier 210.

Alternatively, in the side peripheral area BB1, a distance between two adjacent third barriers 210 is a first distance W32; in the corner peripheral area BB2, a distance between the two adjacent third barriers 210 is a second distance W42; and the first distance W32 is greater than the second distance W42.

Still alternatively, in a case that the second barrier structure 200 includes at least two third barriers 210, a width W31 of a portion, located in the side peripheral area BB1, of the third barrier 210 is greater than a width W41 of a portion, located in the corner peripheral area BB2, of the third barrier 210. Moreover, in the side peripheral area BB1, a distance between two adjacent third barriers 210 is a first distance W32; in the corner peripheral area BB2, a distance between the two adjacent third barriers 210 is a second distance W42; and the first distance W32 is greater than the second distance W42.

Thus, based on the first barrier structure 100, a size of a portion of the second barrier structure 200 located in the corner peripheral area BB2 is reduced, so that a size of the corner peripheral area BB2 of the display panel 1100 is significantly less than a size of the side peripheral area BB1 thereof.

In some embodiments, as shown in FIG. 7, the width W31 of the portion, located in the side peripheral area BB1, of the third barrier 210 is in a range of 40 μm to 50 μm, inclusive; and/or the width W41 of the portion, located in the corner peripheral area BB2, of the third barrier 210 is in a range of 30 μm to 40 μm, inclusive.

In some examples, the width W31 of the portion, located in the side peripheral area BB1, of the third barrier 210 may be in a range of 40 μm to 50 μm, inclusive. For example, the width W31 of the portion, located in the side peripheral area BB1, of the third barrier 210 is 40 μm, or 45 μm, or 50 μm. For example, the width W31 of the portion, located in the side peripheral area BB1, of the third barrier 210 is 50 μm. Here, the width W41 of the portion, located in the corner peripheral area BB2, of the third barrier 210 is less than the width W31 of the portion, located in the side peripheral area BB1, of the third barrier 210. For example, the width W41 of the portion, located in the corner peripheral area BB2, of the third barrier 210 is 40 μm.

In some other examples, in a case that the width W41 of the portion, located in the corner peripheral area BB2, of the third barrier 210 is less than the width W31 of the portion, located in the side peripheral area BB1, of the third barrier 210, the width W41 of the portion, located in the corner peripheral area BB2, of the third barrier 210 is in a range of 30 μm to 40 μm, inclusive. For example, the width W41 of the portion, located in the corner peripheral area BB2, of the third barrier 210 is 30 μm, or 35 μm, or 40 μm. For example, the width W41 of the portion, located in the corner peripheral area BB2, of the third barrier 210 is 40 μm. Here, the width W31 of the portion, located in the side peripheral area BB1, of the third barrier 210 is not specially limited. For example, the width W31 of the portion, located in the side peripheral area BB1, of the third barrier 210 is 50 μm.

In yet some other examples, in a case that the width W41 of the portion, located in the corner peripheral area BB2, of the third barrier 210 is less than the width W31 of the portion, located in the side peripheral area BB1, of the third barrier 210, the width W31 of the portion, located in the side peripheral area BB1, of the third barrier 210 is in a range of 40 μm to 50 μm, inclusive. For example, the width W31 of the portion, located in the side peripheral area BB1, of the third barrier 210 is 40 μm, or 45 μm, or 50 μm. The width W41 of the portion, located in the corner peripheral area BB2, of the third barrier 210 is in a range of 30 μm to 40 μm, inclusive. For example, the width W41 of the portion, located in the corner peripheral area BB2, of the third barrier 210 is 30 μm, or 35 μm, or 40 μm. For example, the width W31 of the portion, located in the side peripheral area BB1, of the third barrier 210 is 40 μm; and the width W41 of the portion, located in the corner peripheral area BB2, of the third barrier 210 is 30 μm. In this way, the width W31 of the portion, located in the side peripheral area BB1, of the third barrier 210 is greater than the width W41 of the portion, located in the corner peripheral area BB2, of the third barrier 210.

In some embodiments, as shown in FIG. 7, in the case that the second barrier structure 200 includes the at least two third barriers 210, a length of the first distance W32 is in a range of 40 μm to 50 μm, inclusive; and/or a length of the second distance W42 is in a range of 30 μm to 40 μm, inclusive.

For example, the length of the first distance W32 is 40 μm, or 45 μm, or 50 μm. For example, the length of the first distance W32 is 40 μm. The length of the second distance W42 is 30 μm, or 35 μm, or 40 μm. For example, the length of the second distance W42 is 30 μm. Thus, the second distance W42 is less than the first distance W32, which is beneficial to realize that a width of a portion of the second barrier structure 200 in the corner peripheral area BB2 is less than a width of a portion of the second barrier structure 200 in the side peripheral area BB1.

It can be understood that the width of the second barrier structure 200 is a width of the one third barrier 210, and in a case that the number of the third barriers 210 is two or more, the width of the second barrier structure 200 is a sum of widths of the third barriers 210 and lengths of distances each between any two adjacent third barriers 210.

For example, as shown in FIG. 7, in a case that the second barrier structure 200 includes two third barriers 210, the width W31 of the portion, located in the side peripheral area BB1, of the third barrier 210 is 40 μm, a length of a first distance W32 between the two adjacent third barriers 210 is 40 μm, the width W41 of the portion, located in the corner peripheral area BB2, of the third barrier 210 is 30 μm, and a length of a second distance W42 between the two adjacent third barriers 210 is 30 μm. Thus, the third dimension L3 of the portion, located in the side peripheral area BB1, of the second barrier structure 200 is 120 μm, and the fourth dimension L4 of the portion, located in the corner peripheral area BB2, of the second barrier structure 200 is 90 μm.

Based on the first barrier structure 100 and the second barrier structure 200 provided in the above embodiments, a sum of the first dimension L1 of the portion, located in the side peripheral area BB1, of the first barrier structure 100 and the third dimension L3 of the portion, located in the side peripheral area BB1, of the second barrier structure 200 is 180 μm; and a sum of the second dimension L2 of the portion, located in the corner peripheral area BB2, of the first barrier structure 100 and the fourth dimension L4 of the portion, located in the corner peripheral area BB2, of the second barrier structure 200 is 110 μm. Thus, referring to FIG. 5, the width H2 of the corner peripheral area BB2 is reduced by 70 μm compared with the width H1 of the side peripheral area BB1, which is very obvious for the size reduction of the display panel 1100. In this way, in the process of bending the peripheral area BB to the non-display side of the display panel 1100, the probability of the portion of the corner peripheral area BB2 being wrinkled is small and the thickness of the stacked film layers is small, thereby reducing the probability of poor display effect caused by the wrinkling of the corner peripheral area BB2 of the display panel 1100 due to bending.

In order to clearly describe arrangement positions and specific structures of the first barrier structure 100 and the second barrier structure 200, the following description is illustrated according to a structure of film layers of the display panel 1100.

In some embodiments, as shown in FIGS. 8 to 11B, the display panel 1100 includes a substrate 1101, a pixel circuit stacked layer 1110, a planarization layer (or planarization layers) 1120, a plurality of light-emitting devices 400 and a encapsulation layer 1130 which are arranged in stack.

The material of the substrate 1101 may include a rigid material such as glass, quartz, plastic, or the like, or may include a flexible material such as polymer resin.

In some examples, as shown in FIGS. 8 to 11B, the pixel circuit stacked layer 1110 refers to a film layer where a plurality of pixel driving circuits are located, which includes a plurality of patterned conductive layers and a first insulating stacked layer 1111. The first insulating stacked layer 1111 is disposed on the substrate 1101, and the first insulating stacked layer 1111 includes a plurality of insulating layers each disposed between two adjacent conductive layers. The plurality of patterned conductive layers are configured to implement circuit structures of the pixel driving circuits.

Each pixel driving circuit includes a plurality of transistors and at least one capacitor Cst. For example, the pixel driving circuit generally includes elements such as a switching transistor, a driving transistor and a storage capacitor. Two opposite ends of the storage capacitor are a reference potential end and a signal holding end respectively, and the signal holding end of the storage capacitor is electrically connected to a control electrode (gate electrode) of the driving transistor. It will be noted that transistors used in the embodiments of the present disclosure may be thin film transistors (TFTs for short), field effect transistors (metal oxide semiconductor, MOS for short) or other switching devices with same characteristics, and the embodiments of the present disclosure are described by taking an example in which the transistors are all thin film transistors.

With reference to FIGS. 8 to 11B, the pixel circuit stacked layer 1110 includes a buffer layer 1, a semiconductor layer 2, a first gate insulating layer 3, a first gate metal layer 4, a second gate insulating layer 5, a second gate metal layer 6, an interlayer dielectric layer 7, a first conductive layer 8 and a passivation layer 9 in a direction perpendicular to the substrate 1101 and away from the substrate 1101 (i.e., in a direction perpendicular to a surface of the substrate 1101 on which the above structures are arranged and away from the substrate 1101).

The semiconductor layer 2 includes active layers 21 of a plurality of TFTs. The first gate metal layer 4 includes gate electrodes 41 of the plurality of TFTs, first plates 42 of a plurality of capacitors Cst, and a plurality of gate scan lines (not shown in the drawings). The second gate metal layer 6 includes second plates 61 of the plurality of capacitors Cst. The first conductive layer 8 includes source electrodes 81 and drain electrodes 82 of the plurality of TFTs, and a plurality of first signal lines 83 (including, for example, data signal lines DL, first voltage signal lines VDD, and second voltage signal lines VSS, etc.).

The first insulating stacked layer 1111 includes the buffer layer 1, the first gate insulating layer 3, the second gate insulating layer 5, the interlayer dielectric layer 7, and the passivation layer 9.

Figure 8:
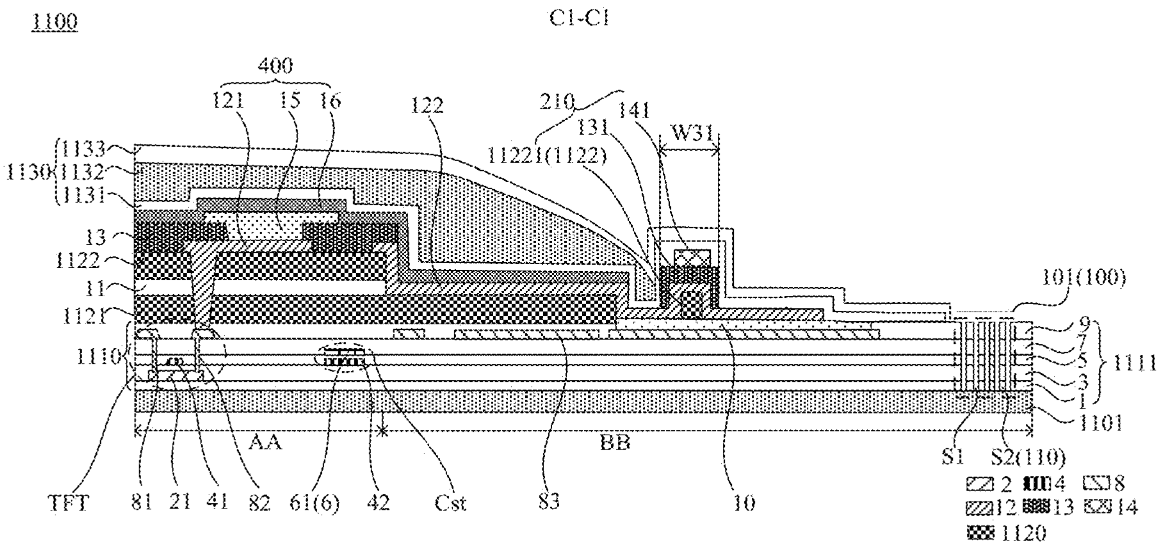
FIG. 8 is a sectional view taken along the section line C1-C1 in FIG. 2.
Figure 9:
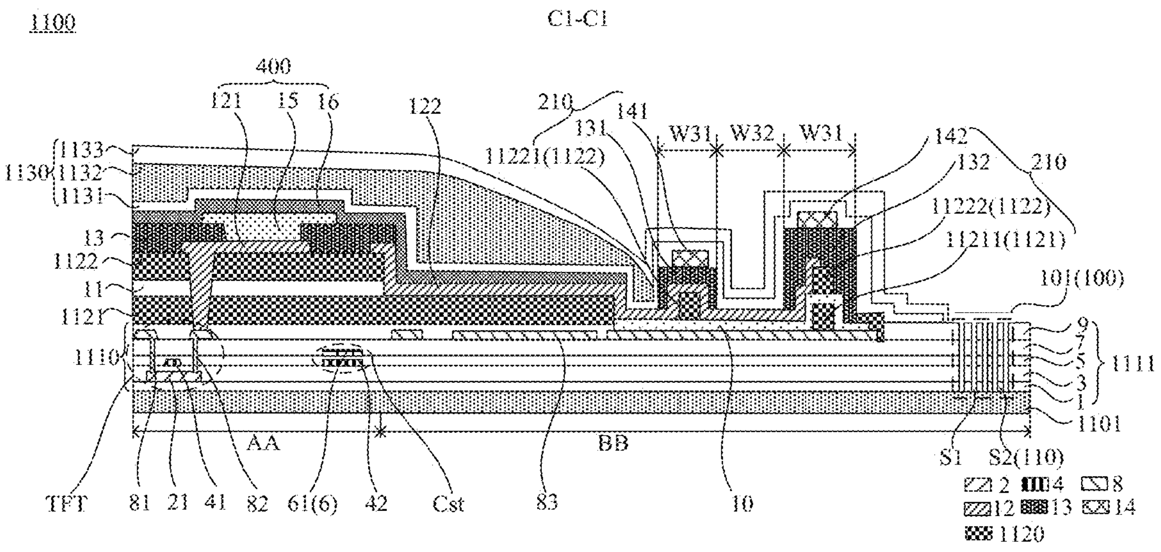
FIG. 9 is another sectional view taken along the section line C1-C1 in FIG. 2.

In some examples, as shown in FIGS. 8 and 9, a surface of the first insulating stacked layer 1111 away from the substrate 1101 is provided with a plurality of grooves S1 therein, and the plurality of grooves S1 are located in the peripheral area BB and at least partially surround the display area AA. The plurality of grooves S1 are sequentially arranged at intervals in a direction away from the display area AA.

Figure 10:
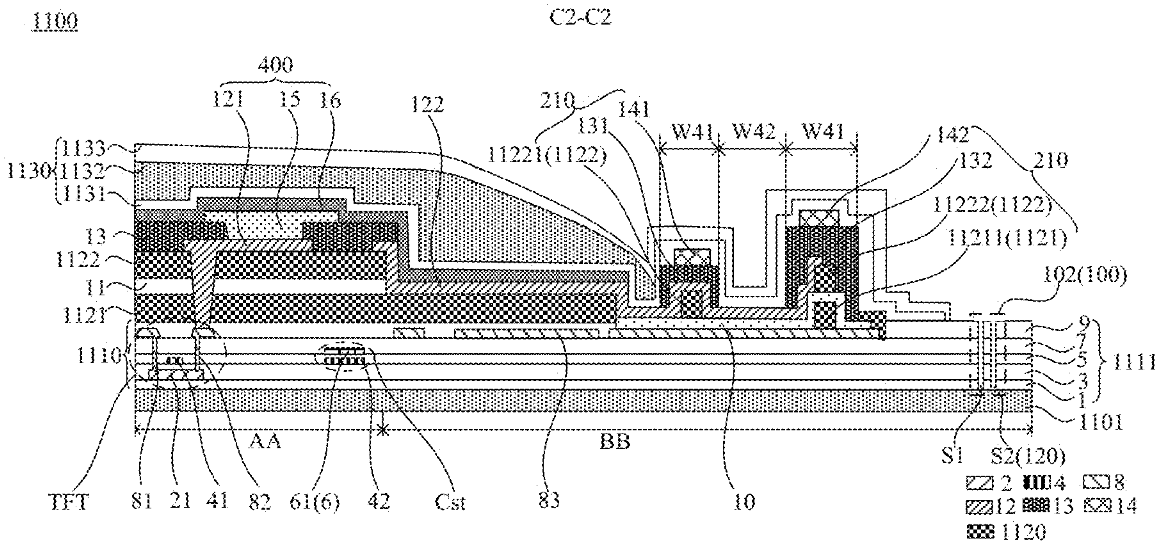
FIG. 10 is a sectional view taken along the section line C2-C2 in FIG. 2.

For example, as shown in FIGS. 9 and 10, portions S2, located between two adjacent grooves S1, of the first insulating stacked layer 1111 form a first barrier 110 and a second barrier 120. As shown in FIG. 9, in the side peripheral area BB1, a portion S2, located between two adjacent grooves S1, of the first insulating stacked layer 1111 forms a first barrier 110. As shown in FIG. 10, in the corner peripheral area BB2, a portion S2, located between two adjacent grooves S1, of the first insulating stacked layer 1111 forms a second barrier 120.

For example, a material of each layer of the first insulating stacked layer 1111 may be an inorganic material. Thus, water absorption of the first barrier structure 100 formed by stacking the inorganic materials is weak, which is beneficial to improving the strength of the first barrier structure 100 and reducing the probability that the crack in the peripheral area BB extend to the display area AA.

The grooves S1 penetrate at least one, relatively away from the substrate 1101, of the buffer layer 1, the first gate insulating layer 3, the second gate insulating layer 5, the interlayer dielectric layer 7, and the passivation layer 9. For example, the grooves S1 penetrate only the passivation layer 9. Alternatively, the grooves S1 penetrate the passivation layer 9 and the interlayer dielectric layer 7. Still alternatively, the grooves S1 penetrate the buffer layer 1, the first gate insulating layer 3, the second gate insulating layer 5, the interlayer dielectric layer 7, and the passivation layer 9. A depth of the groove S1 is set according to practical requirements, and the present disclosure does not limit this.

In some examples, as shown in FIGS. 8 to 11B, the planarization layer 1120 is disposed on a side of the first insulating stacked layer 1111 away from the substrate 1101, and is configured to provide a planar surface, which is beneficial to improve light-emitting performance of the plurality of light-emitting devices 400 fabricated subsequently.

With reference to FIGS. 8 to 11B, the display panel 1100 further includes a second conductive layer 10, and the second conductive layer 10 is configured to form a signal line for transmitting a VDD signal and a signal line for transmitting a VSS signal. For example, signal lines partially transmit the VSS signal. A signal line insulating layer 11 is disposed on a side of the second conductive layer 10 away from the substrate 1101. It can be understood that the signal line insulating layer 11 is usually only partially disposed in the peripheral area BB, and the signal line insulating layer 11 is not shown in the peripheral area BB in FIGS. 8 to 11B, which does not limit the structure of the display panel 1100 of the present disclosure.

In a case that the display panel 1100 includes the first conductive layer 8 and the second conductive layer 10, there are two planarization layers 1120 on a side of the pixel circuit stacked layer 1110 away from the substrate 1101. One planarization layer 1120 is disposed on a side of the passivation layer 9 away from the substrate 1101, and the other planarization layer 1120 is disposed on a side of the signal line insulating layer 11 away from the substrate 1101.

For example, a material of the planarization layer 1120 may be an organic insulating material. The organic insulating material includes at least one of general-purpose polymers such as polymethyl methacrylate (PMMA for short) and polystyrene (PS for short), polymer derivatives having a phenol group, acryl-based polymers, imide-based polymers, aryl ether-based polymers, amide-based polymers, fluorine-based polymers, p-xylene-based polymers, and vinyl alcohol-based polymers. For example, the material of the planarization layer 1120 includes polyimide.

In the following examples, as shown in FIGS. 8 to 11B, a structure in which the display panel 1100 includes the first conductive layer 8, the passivation layer 9, the second conductive layer 10, and the signal line insulating layer 11 will be exemplarily described. There are two planarization layers 1120, in which the planarization layer 1120 disposed on the side of the passivation layer 9 away from the substrate 1101 serves as a first planarization layer 1121, and the planarization layer 1120 disposed on the side of the signal line insulating layer 11 away from the substrate 1101 serves as a second planarization layer 1122.

Figure 11A:
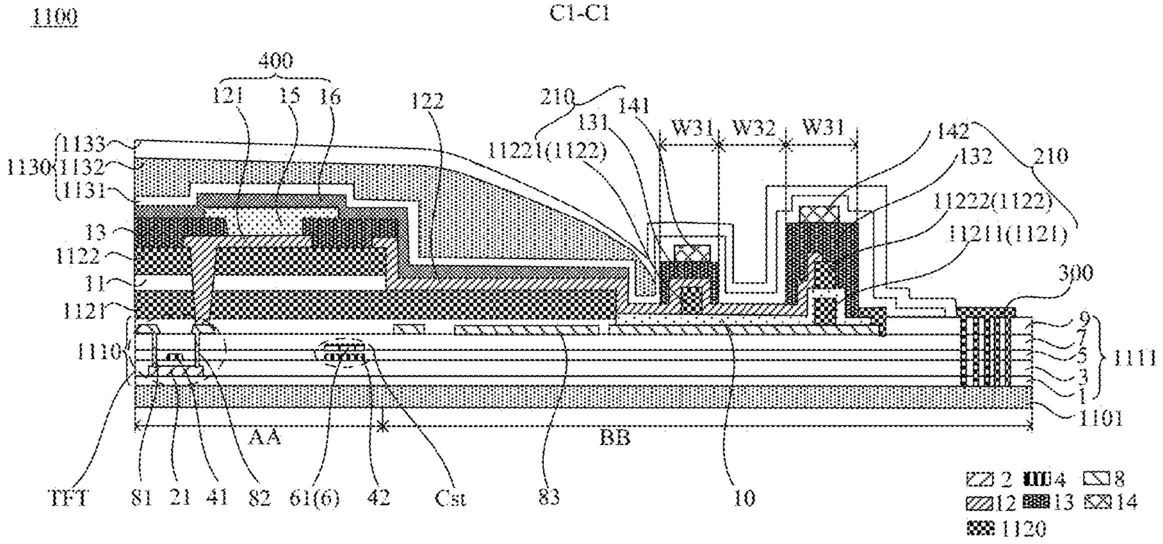
FIG. 11A is yet another sectional view taken along the section line C1-C1 in FIG. 2.
Figure 11B:
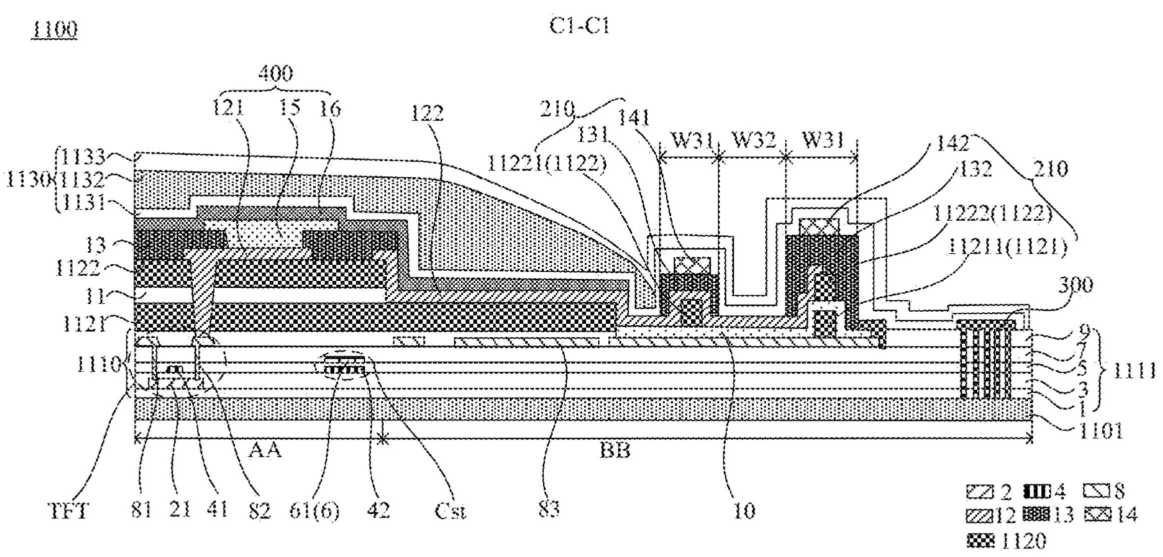
FIG. 11B is yet another sectional view taken along the section line C1-C1 in FIG. 2.

In some embodiments, as shown in FIGS. 11A and 11B, the display panel 1100 further includes a filling part 300. The filling part 300 fills the plurality of grooves S1 and covers the first barrier 110 and the second barrier 120.

The filling part 300 may be formed synchronously with any one or more of a plurality of layers made of organic materials after the pixel circuit stacked layer 1110. For example, the filling part 300 is made of the material of the planarization layers 1120. The planarization layers 1120 are disposed on a side of the first insulating stacked layer 1111 away from the substrate 1101, such that the filling part 300 is made of a same material and disposed in a same layer as one planarization layer 1120. That is, the material of the filling part 300 is the same as the material of the one planarization layer 1120. The "same layer" refers to a layer structure that is formed by performing, using a same mask, a single patterning process on a film layer for forming specific patterns which is formed by a same film forming process. Depending on different specific patterns, the single patterning process may include several exposure, development or etching processes, and the specific patterns in the formed layer structure may be continuous or discontinuous, and these specific patterns may also be at different heights or have different thicknesses.

In some examples, as shown in FIGS. 8 to 11B, the plurality of light-emitting devices 400 are disposed on a side of the second planarization layer 1122 away from the substrate 1101, and the light-emitting devices 400 are electrically connected to the pixel driving circuits in the pixel circuit stacked layer 1110. Film layers in which the plurality of light-emitting devices 400 are located include a plurality of pixel anode layers 12, a pixel defining layer 13, a light-emitting function layer 15, and a cathode layer 16. Portions, whose orthographic projections on the substrate 1101 are overlapped, of a pixel anode pattern 121 (for providing holes), the light-emitting function layer 15, and the cathode layer 16 may form a single light-emitting device 400. The pixel anode layer 12 and the cathode layer 16 respectively inject holes and electrons into the light-emitting function layer 15, and light emission is generated when excitons generated by a combination of the holes and the electrons transition from an excited state to a ground state.

It will be noted that in some examples, as shown in FIGS. 8 to 11B, the display panel 1100 further includes a spacer layer 14. The spacer layer 14 is disposed on a side of the pixel defining layer 13 away from the substrate 1101. The spacer layer 14 is configured to make supporting parts (not shown in the drawings) for supporting a mask (required for fabricating the light-emitting function layer 15).

In some examples, as shown in FIGS. 8 to 11B, the encapsulation layer 1130 is disposed on a side of the cathode layer 16 away from the substrate 1101. The encapsulation layer 1130 may be an encapsulation film. The number of layers of encapsulation films included in the encapsulation layer 1130 is not limited. In some embodiments, the encapsulation layer 1130 may include one layer of encapsulation film, or two or more layers of encapsulation films that are stacked.

For example, as shown in FIGS. 8 to 11B, the encapsulation layer 1130 includes a first inorganic encapsulation layer 1131, an organic encapsulation layer 1132 and a second inorganic encapsulation layer 1133 that are stacked in sequence in the direction perpendicular to the substrate 1101 and away from the substrate 1101. A material of the first inorganic encapsulation layer 1131 and the second inorganic encapsulation layer 1133 includes any one or more of silicon nitride ($SiN_x$), silicon oxynitride (SiON) or silicon oxide ($SiN_x$). A material of the organic encapsulation layer includes a polymer resin such as polyimide.

As shown in FIGS. 11A and 11B, the first inorganic encapsulation layer 1131 and the second inorganic encapsulation layer 1133 may cover the filling part 300 filled in the first barrier structure 100, or may not cover the filling part 300 filled in the first barrier structure 100, where an orthographic projection of the organic encapsulation layer 1132 on the substrate 1101 and an orthographic projection of the first barrier structure 100 on the substrate 1101 have a distance therebetween.

Based on the above film structure of the display panel 1100, as shown in FIG. 8, in the case that the second barrier structure 200 includes one third barrier 210, the third barrier 210 includes a first sub-portion 11221, a second sub-portion 131 and a third sub-portion 141.

As shown in FIGS. 9 and 10, in the case that the second barrier structure 200 includes two third barriers 210, a third barrier 210 relatively proximate to the display area AA includes a first sub-portion 11221, a second sub-portion 131 and a third sub-portion 141. The first sub-portion 11221 and the second planarization layer 1122 are made of a same material and disposed in a same layer. The second sub-portion 131 and the pixel defining layer 13 are made of a same material and disposed in a same layer. The third sub-portion 141 and the spacer layer 14 are made of a same material and disposed in a same layer.

A third barrier 210 relatively away from the display area AA includes a fourth sub-portion 11211, a fifth sub-portion 11222, a sixth sub-portion 132 and a seventh sub-portion 142. The fourth sub-portion 11211 and the first planarization layer 1121 are made of a same material and disposed in a same layer. The fifth sub-portion 11222 and the second planarization layer 1122 are made of the same material and disposed in the same layer. The sixth sub-portion 132 and the pixel defining layer 13 are made of the same material and disposed in the same layer. The seventh sub-portion 142 and the spacer layer 14 are made of the same material and disposed in the same layer.

It will be noted that the specific composition of the two third barriers 210 further includes materials of other films, as long as a height of the third barrier 210 relatively away from the display area AA is not less than a height of the third barrier 210 relatively proximate to the display area AA, so as to improve the blocking effect of the third barriers 210 on the organic material in the display area AA, and the specific film structure of the third barriers 210 is not limited in the present disclosure.

Figure 12:
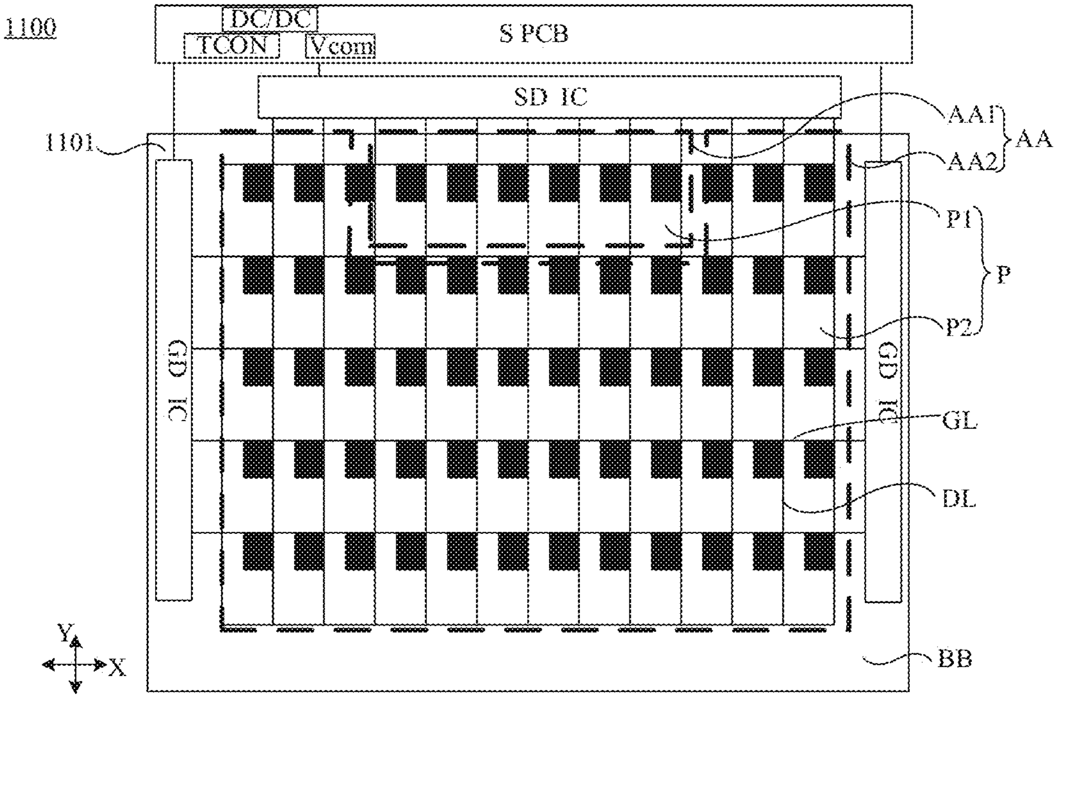
FIG. 12 is another structural diagram of a display panel, in accordance with some embodiments.

In some other embodiments, the display panel 1100 includes a transparent function device (e.g., an under-screen camera) and a function device circuit for driving an operation of the transparent function device. As shown in FIG. 12, the display area AA includes a transparent display area AA1 and a main display area AA2 at least partially surrounding the transparent display area AA1. The transparent display area AA1 is configured to be provided with the transparent function device Q. As shown in FIG. 1, the function device Q is disposed to be transparent, the image display effect cannot be influenced when a function of the function device Q is implemented, and therefore the display effect of the full-screen with the under-screen camera structure is realized. The transparent function device Q includes one or more of an infrared sensing device, a photosensitive device, a camera and other function devices. For example, the transparent function device Q is a camera.

As shown in FIG. 12, the display area AA is provided therein with a plurality of sub-pixels P, a plurality of scanning timing signal lines GL extending in a horizontal direction X, and a plurality of data signal lines DL extending in a vertical direction Y. For convenience of description, the plurality of sub-pixels P are described in the present disclosure by taking an example in which the plurality of sub-pixels P are arranged in a matrix. In this case, sub-pixels P arranged in a line in the horizontal direction X are referred to as a row of sub-pixels, sub-pixels P arranged in a line in the vertical direction Y are referred to as a column of sub-pixels, a row of sub-pixels may be electrically connected to one or two scan timing signal lines GL, and a column of sub-pixels may be electrically connected to one data signal line DL.

The sub-pixel P is provided therein with a light-emitting device (not shown in drawings) and a pixel driving circuit (not shown in drawings) for controlling the sub-pixel P to display an image. The pixel driving circuit is disposed on the substrate 1101 of the display panel 1100. A scanning timing signal line GL connected to the sub-pixel P is used for transmitting a scanning signal gate to the pixel driving circuit of the sub-pixel P; a data line DL connected to the sub-pixel P is used for transmitting a data signal Vdata to the pixel driving circuit of the sub-pixel P, and data signals Vdata are from a source driving chip (source driver integrated circuit, SD IC for short) electrically connected to the plurality of data lines DL.

As shown in FIG. 12, the peripheral area BB of the display panel 1100 is provided with at least one gate driving circuit (gate driver integrated circuit, GD IC for short). The gate driving circuit GD IC includes a plurality of shift registers (gate driver on array, GOA for short) cascaded-coupled. The plurality of shift registers GOA are arranged in sequence in the vertical direction Y.

With reference to FIG. 12, the display panel 1100 further includes a driving circuit board (source printed circuit board, S PCB for short). The driving circuit board S PCB includes driving circuits such as a timing controller TCON, a power management chip DC/DC, and an adjustable resistance voltage division circuit Vcom (for generating Vcom signal). The driving circuit board S PCB is electrically connected to the source driver SD IC to control the source driver SD IC to output the data signals Vdata. And the driving circuit board S PCB is electrically connected to the gate driving circuit GD IC to transmit a control signal to a first shift register GOA, so that respective shift registers GOA scan the plurality of sub-pixels P arranged in the matrix form line by line. In this way, image display is realized by the combined action of electronic elements and circuits such as the driving circuit board S PCB, the source driver SD IC, the gate driving circuit GD IC, the pixel driving circuit, and the light-emitting device.

An area where the electronic components and circuits such as the gate driving circuit GD IC, the source driving circuit SD IC, and the driving circuit board S PCB are located is disposed on the non-display side of the display panel 1100 through bending. In this way, a boundary area that is between the display area AA and the peripheral area BB and bent to the non-display side is realized smooth transition, which is beneficial to improving the screen-to-body ratio of the display panel 1100 and realizing the full-screen display effect of the display apparatus 1000.

For example, as shown in FIG. 12, the plurality of sub-pixels P includes first sub-pixels P1 and second sub-pixels P2. The first sub-pixels P1 are disposed in the transparent display area AA 1. The second sub-pixels P2 are disposed in the main display area AA2. A function device circuit (not shown in FIG. 12) for driving the function of the function device Q is also provided in the first sub-pixel P1. It can be understood that, in order not to affect the normal operation of a pixel driving circuit in the first sub-pixel P1, the function device circuit is made of a transparent material, so that light emitted by a light-emitting device 400 in the first sub-pixel P1 can be transmitted, and the image display may be realized.

Figure 13:
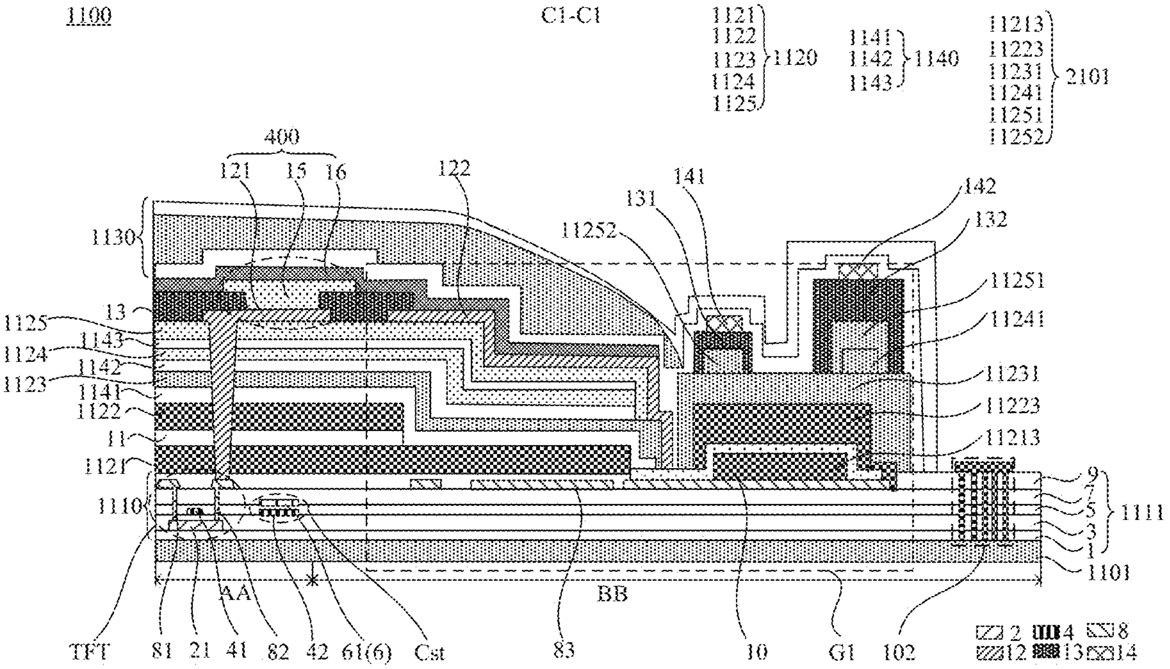
FIG. 13 is yet another sectional view taken along the section line C1-C1 in FIG. 2.
Figure 14:
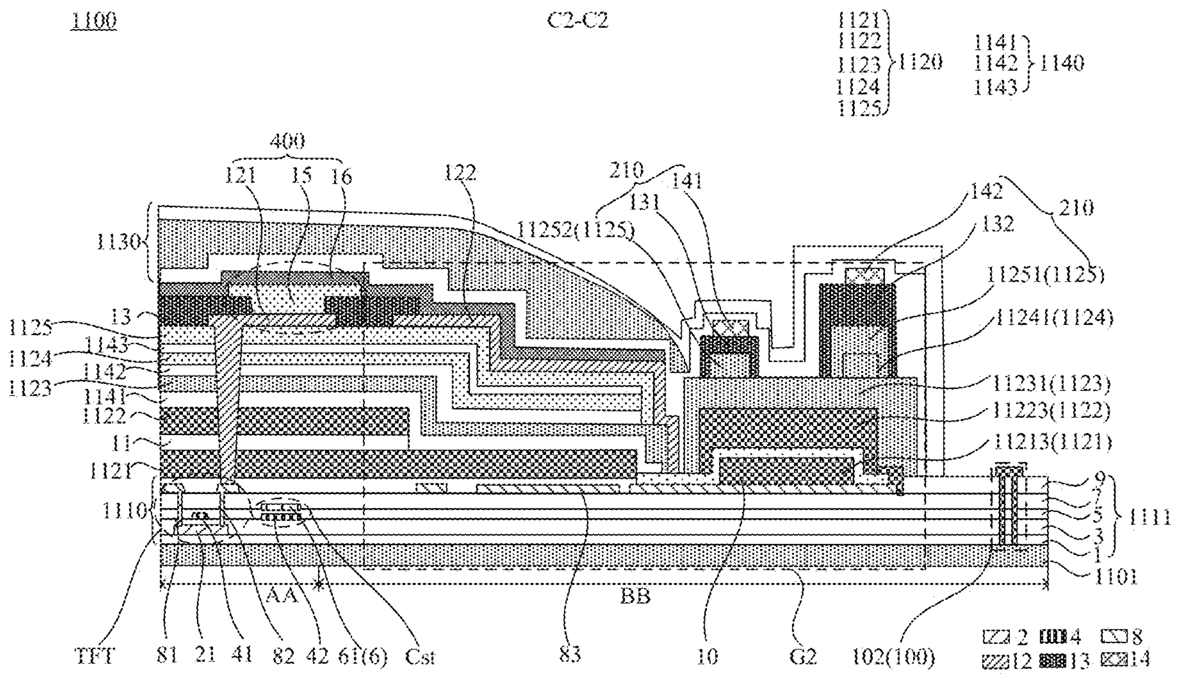
FIG. 14 is another sectional view taken along the section line C2-C2 in FIG. 2.

Based on the functions of the display panel 1100, as shown in FIGS. 13 and 14, the display panel 1100 includes a plurality of planarization layers 1120 and at least one transparent conductive layer 1140. The plurality of planarization layers 1120 are disposed between the pixel circuit stacked layer 1111 and film layers where the light-emitting devices 400 are located, and a portion of the plurality of planarization layers is configured to planarize a surface above film layers where the pixel driving circuits are located, and another portion of the plurality of planarization layers is configured to planarize a surface above film layers where the function device circuits are located, so that the light-emitting device 400 is disposed on a planarized surface.

The at least one transparent conductive layer 1140 is configured to form the function device circuit to drive the operation of the under-screen camera. The at least one transparent conductive layer 1140 includes transparent signal line (not shown in drawings) in the transparent display area AA1, and the transparent signal lines are electrically connected to the first sub-pixels P1.

A transparent conductive layer 1140 is disposed between two adjacent planarization layers 1120. It will be noted that the embodiments of the present disclosure do not limit a specific pattern of the at least one transparent conductive layer 1140, and mainly describe that a portion of the plurality of planarization layers 1120 in the peripheral area BB of the display panel 1100 is used to fabricate the second barrier structure 200. In addition, the pixel defining layer 13 on the side of the planarization layer 1120 away from the substrate 1101 may also be used to fabricate a portion of the third barrier 210.

For example, the plurality of planarization layers 1120 includes five layers and the at least one transparent conductive layer 1140 includes three layers. A planarization layer 1120 on the side of the passivation layer 9 away from the substrate 1101 serves as a first planarization layer 1121; a planarization layer 1120 on the side of the signal line insulating layer 11 away from the substrate 1101 serves as a second planarization layer 1122. And a transparent conductive layer 1140 is disposed on a side of the second planarization layer 1122 away from the substrate 1101, and this transparent conductive layer 1140 serves as a first transparent conductive layer 1141. A planarization layer 1120 is disposed on a side of the first transparent conductive layer 1141 away from the substrate 1101, and this planarization layer 1120 serves as a third planarization layer 1123. A transparent conductive layer 1140 is disposed on a side of the third planarization layer 1123 away from the substrate 1101, and this transparent conductive layer 1140 serves as a second transparent conductive layer 1142. A planarization layer 1120 is disposed on a side of the second transparent conductive layer 1142 away from the substrate 1101, and this planarization layer 1120 serves as a fourth planarization layer 1124. A transparent conductive layer 1140 is disposed on a side of the fourth planarization layer 1124 away from the substrate 1101, and this transparent conductive layer 1140 serves as a third transparent conductive layer 1143. A planarization layer 1120 is disposed on a side of the third transparent conductive layer 1143 away from the substrate 1101, and this planarization layer 1120 serves as a fifth planarization layer 1125. Thus, each transparent conductive layer 1140 is located between two adjacent planarization layers 1120. The at least one planarization layer 1120 is configured to planarize a surface above the at least one transparent conductive layer 1140 and insulate the at least one transparent conductive layer 1140.

The size of the first barrier structure 100 is not affected by the transparent function device and the film layers where the function device circuit is located; the second barrier structure 200 further includes some structures of the film layers where the function device circuit is located on the basis of the conventional film layer structure, so that the embodiments of the present disclosure mainly improve the structure of the second barrier structure 200.

In some embodiments, as shown in FIG. 3, the peripheral area BB includes a plurality of side peripheral areas BB1, a plurality of corner peripheral areas BB2, and a plurality of transition peripheral areas BB3. A side peripheral area BB1 and a corner peripheral area BB2 that are adjacent are connected through a transition peripheral area BB3 therebetween. A junction of the transition peripheral area BB2 and the corner peripheral area BB2 forms an inward concave shape, and the inward concave shape is sunken towards a direction proximate to the display area AA.

As shown in FIG. 7, the third barrier 210 includes a first barrier section 201, a second barrier section 202 and a third barrier section 203. The first barrier section 201 extends along the side peripheral area BB1. The second barrier section 202 extends along the corner peripheral area BB2. The third barrier section 203 is connected between the first barrier section 201 and the second barrier section 202. That is, the first barrier section 201 is located in the side peripheral area BB1, the second barrier section 202 is located in the corner peripheral area BB2, and the third barrier section 203 is located in the transition peripheral area BB3. A width of the third barrier section gradually decreases from an end, connected to the first barrier section 201, of the third barrier section 203 to an end, connected to the second barrier section 202, of the third barrier section 203.

Since the third dimension L3 of the portion, located in the side peripheral area BB1, of the second barrier structure 200 is greater than the fourth dimension L4 of the portion, located in the corner peripheral area BB2, of the second barrier structure 200, in a case that the second barrier structure 200 forms a closed-loop structure around the display area AA, the width of the third barrier section 203 of the second barrier structure 200 located in the transition peripheral area BB3 gradually decreases to smoothly connect the first barrier section 201 and the second barrier section 202.

In some embodiments, as shown in FIGS. 13 and 14, in the second barrier structure 200, the third barrier 210 includes a first pad layer (or first pad layers) 2101 and a second pad layer 2102 arranged in a direction perpendicular to the substrate 1101; the first pad layer 2101 is located in the planarization layer 1120, and the second pad layer 2102 is located on the pixel defining layer 13.

It will be noted that, as shown in FIGS. 13 and 14, in a case that there are the plurality of planarization layers 1120, there also are a plurality of first pad layers 2101 each made of a same material and disposed in a same layer as a planarization layer 1120. To facilitate distinguishing the first pad layers 2101 formed by different planarization layers 1120, the plurality of first pad layers 2101 may be referred to as, for example, a first pad sub-layer 11213, a second pad sub-layer 11223, a third pad sub-layer 11231, a fourth pad sub-layer 11241, a fifth pad sub-layer 11251 and a sixth pad sub-layer 11252 (the fifth pad sub-layer 11251 and the sixth pad sub-layer 11252 are made of a same material and disposed in a same layer) in a direction perpendicular to the substrate 1101 and away from the substrate 1101.

Figure 15:
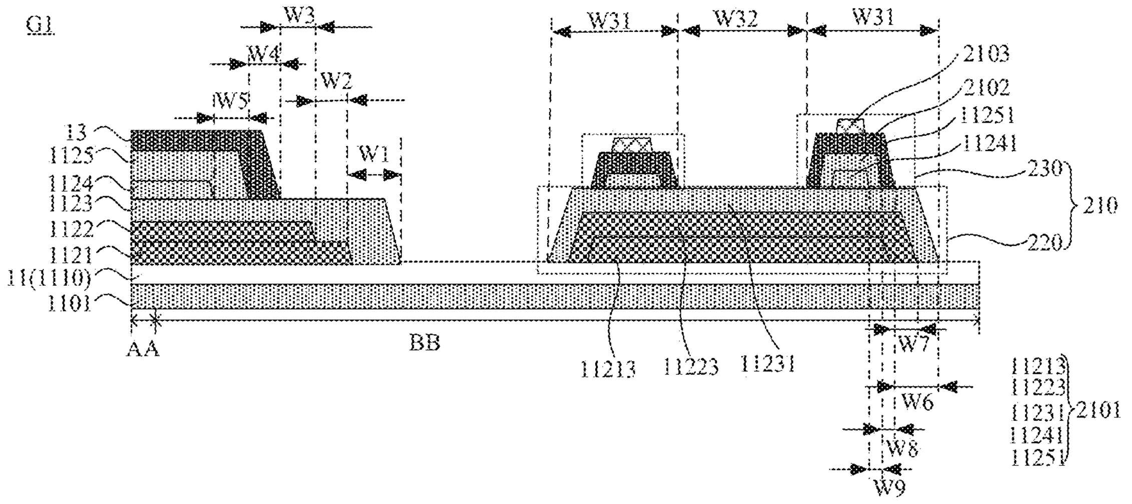
FIG. 15 is a partial enlargement view of the region G1 of the display panel provided in FIG. 13.
Figure 14:
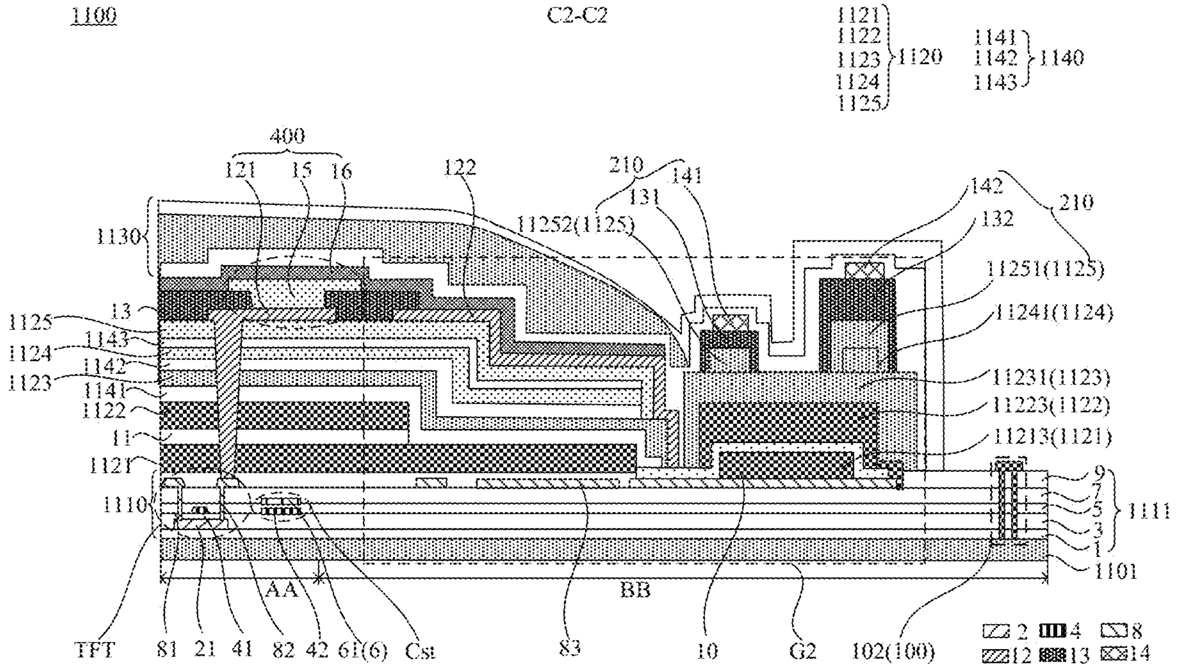
Figure 15:
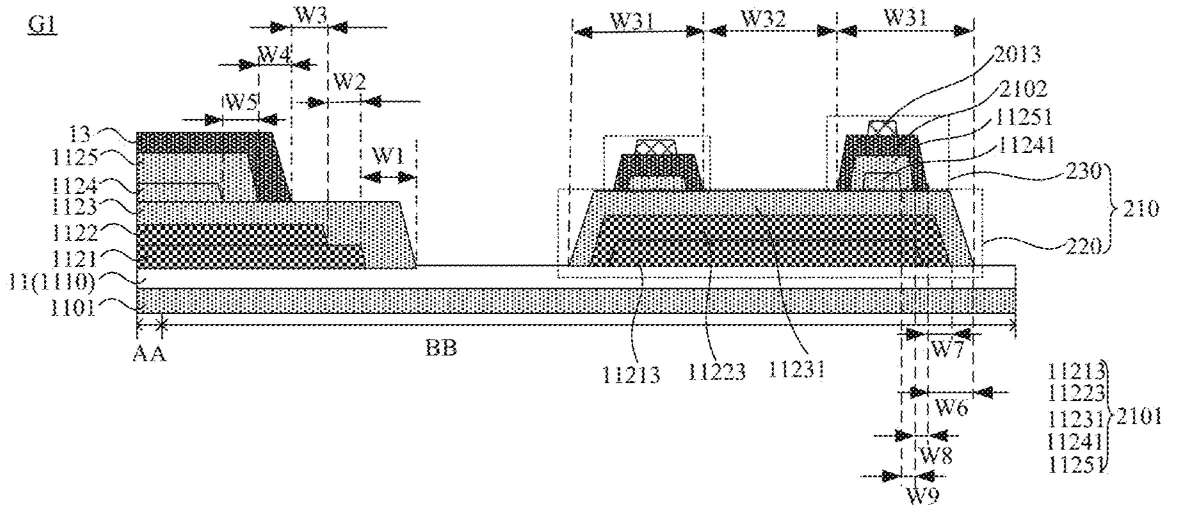
Figure 16:
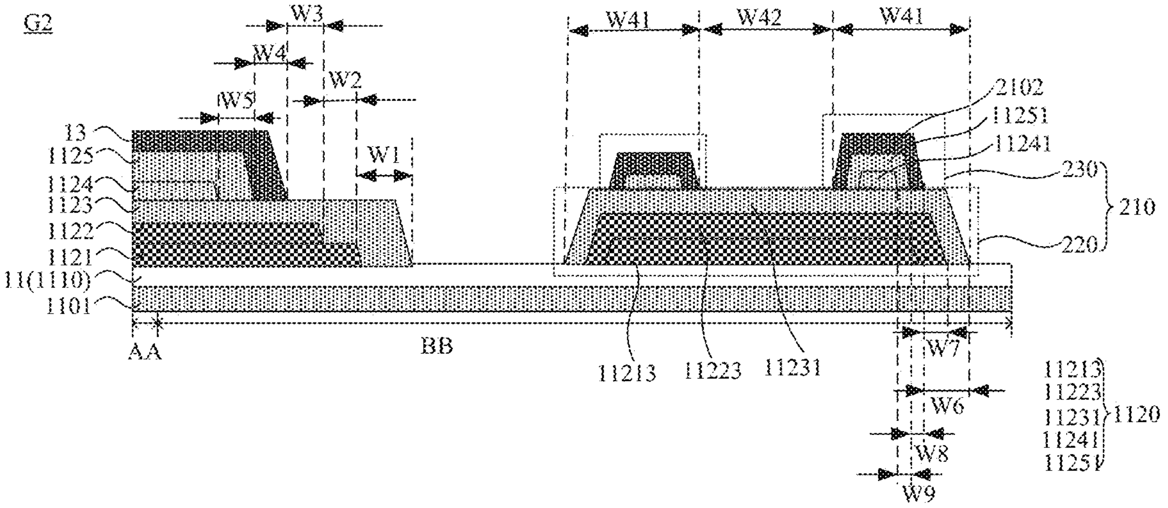
FIG. 16 is a partial enlargement view of the region G2 of the display panel provided in FIG. 14.

In some examples, as shown in FIGS. 15 and 16, in a case that the display panel 1100 further includes the spacer layer 14, the third barrier 210 further includes a third pad layer 2103 disposed on a side of the second pad layer 2102 away from the substrate 1101 in the side peripheral area BB1, and the third pad layer 2103 is located in the spacer layer 14.

It will be noted that the third pad layer 2103 includes the third sub-portion 141 and the seventh sub-portion 142 mentioned in the above embodiments, which are made of the same material and are disposed in the same layer as the spacer layer 14, and this is for convenience of description only and is not limited thereto.

In some embodiments, as shown in FIGS. 15 and 16, the third barrier 210 includes a first supporting part 220 and a second supporting part 230. An orthographic projection of the second supporting part 230 on the substrate 1101 is within a range of an orthographic projection of the first supporting part 220 on the substrate 1101. In this way, the first supporting part 220 is closer to the substrate 1101 relative to the second supporting part 230, the orthographic projection of the second supporting part 230 on the substrate 1101 is within the range of the orthographic projection of the first supporting part 220 on the substrate 1101, a "step-like" structure is formed, and the first supporting part 220 may provide a stable support effect for the second supporting part 230.

In some examples, as shown in FIGS. 15 and 16, the first supporting part 220 includes multiple first pad layers 2101. In the first supporting part 220, for any two adjacent first pad layers 2101, an orthographic projection of a first pad layer 2101 relatively proximate to the substrate 1101 on the substrate 1101 is within a range of an orthographic projection of a first pad layer 2101 relatively away from the substrate 1101 on the substrate 1101.

For example, with continued reference to FIGS. 15 and 16, the first supporting part 220 includes the first pad sub-layer 11213, the second pad sub-layer 11223, and the third pad sub-layer 11231. An orthographic projection of the first pad sub-layer 11213 on the substrate 1101 is within a range of an orthographic projection of the second pad sub-layer 11223 on the substrate 1101. The orthographic projection of the second pad sub-layer 11223 on the substrate 1101 is within a range of an orthographic projection of the third pad sub-layer 11231 on the substrate 1101.

In some examples, as shown in FIGS. 15 and 16, the second supporting part 230 is disposed on a side of the first supporting part 220 away from the substrate 1101. The second supporting part 230 includes at least one first pad layer 2101 and one second pad layer 2102. An orthographic projection of a first pad layer 2101 adjacent to the second pad layer 2102 on the substrate 1101 is within a range of an orthographic projection of the second pad layer 2102 on the substrate 1101.

For example, with continued reference to FIGS. 15 and 16, in the case that the second barrier structure 200 includes two third barriers 210, a second supporting part 230 relatively away from the display area AA includes two first pad layers 2101, for example, the fourth pad sub-layer 11241 and the fifth pad sub-layer 11251, and a second pad layer 2102. An orthographic projection of the fourth pad sub-layer 11241 on the substrate 1101 is within a range of an orthographic projection of the fifth pad sub-layer 11251 on the substrate 1101, such that an upper layer may cover a lower layer, forming a "the latter covering the former" structure. That is, a first pad layer 2101 formed previously is covered by a first pad layer 2101 formed next. And, a second supporting part 230 relatively proximate to the display area AA includes a second pad layer 2102, for example, the sixth pad layer 11252 and the second pad layer 2102. An orthographic projection of the sixth pad layer 11252 on the substrate 1101 is within a range of an orthographic projection of the second pad layer 2102 on the substrate 1101.

The "the latter covering the former" structure of the first supporting part 220, the "the latter covering the former" structure of the second supporting part 230, and the "step-like" structure of the second supporting part 230 and the first supporting part 220 reduce a slope of a side wall of the third barrier 210, which is advantageous for the first inorganic encapsulation layer 1131 and the second inorganic encapsulation layer 1133 in the subsequent encapsulation layer 1130 form continuous film layers on a surface of the third barrier 210 away from the substrate 1101 by deposition, thereby improving the encapsulation effect of the display panel 1100.

It will be noted that, in the case that the display panel 1100 further includes the spacer layer 14, the second supporting part 230 may include the third pad layer 2103 or may not include the third pad layer 2103. Because a volume of the third pad layer 2103 is small, and on the basis of the "step-like" structure of the first supporting part 220 and the second supporting part 230, the influence of the third pad layer 2103 on the slope of the side wall of the second barrier structure 200 may be ignored, and the third pad layer 2103 does not need to satisfy the setting of "the latter covering the former". For example, an orthographic projection of the third pad layer 2103 on the substrate 1101 is within a range of an orthographic projection of the second supporting part 230 on the substrate 1101.

In some embodiments, as shown in FIGS. 15 and 16, the second barrier structure 200 includes two third barriers 210, the two third barriers 210 share a first supporting part 220, and orthographic projections of second supporting parts 230 of the two third barriers 210 on the substrate 1101 are both within a range of an orthographic projection of the first supporting part 220 on the substrate 1101.

For example, the second barrier structure 200 includes two third barriers 210, and the two third barriers 210 share a first supporting part 220. A width of an orthographic projection of a portion, located in the corner peripheral area BB2, of the first supporting part 220 on the substrate 1101 is 90 μm; and a width of an orthographic projection of a portion, located in the side peripheral area BB1, of the first supporting part 220 on the substrate 1101 is 120 μm.

Orthographic projections of second supporting parts 230 of the two third barriers 210 on the substrate 1101 are both within a range of an orthographic projection of the first supporting part 220 on the substrate 1101.

As shown in FIG. 15, in the side peripheral area BB1, a width of an orthographic projection of a second supporting part 230 relatively away from the display area AA on the substrate 1101 is 30 μm. There are a plane where a side edge, away from the display area AA, of the second supporting part 230 is located, and a plane where a side edge, away from the display area AA, of the first supporting part 220 is located, and a distance W6 between the two planes is 10 μm. In this way, a portion between the side edge, proximate to the display area AA, of the second supporting part 230 relatively away from the display area AA and the side edge, away from the display area AA, of the first supporting part 220 forms a third barrier 210. There are a plane where a side edge, away from the display area AA, of the second pad sub-layer 11223 is located, and a plane where a side edge, away from the display area AA, of the first pad sub-layer 11213 is located, and a distance W7 between the two planes is 5 μm. There are a plane where a side edge, away from the display area AA, of the fourth pad sub-layer 11241 is located, and a plane where a side edge, away from the display area AA, of the fifth pad sub-layer 11251 is located, and a distance W9 between the two planes is 4 μm. There are a plane where a side edge, away from the display area AA, of the second pad layer 2102 is located, and the plane where the side edge, away from the display area AA, of the fifth pad sub-layer 11251 is located, and a distance W8 between the two planes is 4 μm.

A width of an orthographic projection of a second supporting part 230 relatively proximate to the display area AA on the substrate 1101 is 30 μm. There are a plane where a side edge, proximate to the display area AA, of the second supporting part 230 is located, and the plane where the side edge, away from the display area AA, of the first supporting part 220 is located, and a distance between the two planes is also 10 μm. In this way, a portion between the side edge, away from the display area AA, of the second supporting part 230 relatively proximate to the display area AA and the side edge, proximate to the display area AA, of the first supporting part 220 forms a third barrier 210.

A distance between the two second supporting parts 230 located in the side peripheral area BB1 is 40 μm. That is, a distance, in the side peripheral area BB1, between the two third barriers 210 is 40 μm.

As shown in FIG. 16, in the corner peripheral area BB2, a width of an orthographic projection of a second supporting part 230 relatively proximate to the display area AA on the substrate 1101 is 20 μm. There are a plane where a side edge, proximate to the display area AA, of the second supporting part 230 is located, and a plane where a side edge, proximate to the display area AA, of the first supporting part 220 is located, and a distance between the two planes is 10 μm. In this way, a portion between the side edge, away from the display area AA, of the second supporting part 230 relatively proximate to the display area AA and the side edge, proximate to the display area AA, of the first supporting part 220 forms a third barrier 210.

A width of an orthographic projection of a second supporting part 230 relatively away from the display area AA on the substrate 1101 is 20 μm. There are a plane where a side edge, away from the display area AA, of the second supporting part 230 is located, and a plane where a side edge, away from the display area AA, of the first supporting part 220 is located, and a distance between the two planes is 10 μm. In this way, a portion between a side edge, proximate to the display area AA, of the second supporting part 230 relatively away from the display area AA and a side edge, away from the display area AA, of the first supporting part 220 forms a third barrier 210. There are a plane where a side edge, away from the display area AA, of the second pad sub-layer 11223 is located, and a plane where a side edge, away from the display area AA, of the first pad sub-layer 11213 is located, and a distance W7 between the two planes is 5 μm. There are a plane where a side edge, away from the display area AA, of the fourth pad sub-layer 11241 is located, and a plane where a side edge, away from the display area AA, of the fifth pad sub-layer 11251 is located, and a distance W9 between the two planes is 4 μm. There are a plane where a side edge, away from the display area AA, of the second pad layer 2102 is located, and the plane where the side edge, away from the display area AA, of the fifth pad sub-layer 11251 is located, and a distance W8 between the two planes is 4 μm.

A distance between the two second supporting parts 230 located in the corner peripheral area BB2 is 30 μm. That is, a distance, in the corner peripheral area BB2, between the two third barriers 210 is 30 μm.

Thus, in the case that the display panel 1100 includes the plurality of planarization layers 1120 and the plurality of transparent conductive layers 1140, because the second barrier structure 200 has more organic material film layers in the direction perpendicular to the substrate 1101, a height difference of the formed second barrier structure 200 is large and a slope of a side edge is steep, and the "step-like" structure of the first supporting part 220 and the second supporting part 230 may reduce the slope of the side edge of the second barrier structure 200, which is beneficial to improving the yield of the transparent signal lines in the subsequently manufactured transparent conductive layers 1140.

In addition, with continued reference to FIGS. 15 and 16, among portions, extending to the peripheral area BB, of a stacked structure of the plurality of planarization layers 1120 and the pixel defining layer 13, an orthographic projection of the second planarization layer 1122 on the substrate 1101 is within a range of an orthographic projection of the first planarization layer 1121 on the substrate 1101; an orthographic projection of the third planarization layer 1123 on the substrate 1101 covers the orthographic projection of the first planarization layer 1121 on the substrate 1101; an orthographic projection of the fourth planarization layer 1124 on the substrate 1101 is within a range of the orthographic projection of the second planarization layer 1122 on the substrate 1101; an orthographic projection of the fifth planarization layer 1125 on the substrate 1101 is within the orthographic projection of the second planarization layer 1122 on the substrate 1101 and covers the orthographic projection of the fourth planarization layer 1124 on the substrate 1101; the orthographic projection of the pixel defining layer 13 on the substrate 1101 covers the orthographic projection of the fifth planarization layer 1125 on the substrate 1101 and is within the range of the orthographic projection of the second planarization layer 1122 on the substrate 1101.

There are a plane where a side edge, away from the display area AA, of the first planarization layer 1121 is located, and a plane where a side edge, away from the display area AA, of the second planarization layer 1122 is located, and a distance W2 between the two planes is 10 μm. There are a plane where a side edge, away from the display area AA, of the third planarization layer 1123 is located, and the plane where the side edge, away from the display area AA, of the first planarization layer 1121 is located, and a distance W1 between the two planes is 20 μm. There are a plane where a side edge, away from the display area AA, of the fourth planarization layer 1124 is located, and a plane where a side edge, away from the display area AA, of the fifth planarization layer 1125 is located, and a distance W5 between the two planes is 10 μm. There are a plane where a side edge, away from the display area AA, of the pixel defining layer 13 is located, and the plane where the side edge, away from the display area AA, of the fifth planarization layer 1125 is located, and a distance W4 between the two planes is 10 μm. There are the plane where the side edge, away from the display area AA, of the pixel defining layer 13 is located, and the plane where the side edge, away from the display area AA, of the second planarization layer 1122 is located, and a distance W3 between the two planes is 10 μm.

It will be noted that, since the thickness of the transparent signal line is small, the influence on the thickness and the width of the second barrier structure 200 may be approximately ignored, and the transparent signal line extending from the display area AA to the peripheral area BB and the position relationship thereof with the second barrier structure 200 are not shown in FIGS. 15 and 16, which does not limit the embodiments of the present disclosure.

In some embodiments, as shown in FIGS. 15 and 16, the second barrier structure 200 includes two third barriers 210, and a number of first pad layers 2101 included in a third barrier 210 relatively away from the display area AA is greater than a number of first pad layers 2101 included in a third barrier 210 relatively proximate to the display area AA.

For example, the third barrier 210 relatively away from the display area AA includes five first pad layers 2101; and the third barrier 210 relatively proximate to the display area AA includes four first courses 2101.

In some embodiments, as shown in FIGS. 15 and 16, a height of a portion, located in the corner peripheral area BB2, of the third barrier 210 is less than a height of a portion, located in the side peripheral area BB1, of the third barrier 210.

For example, in the case that the second barrier structure 200 includes one third barrier 210, a height of a portion, located in the corner peripheral area BB2, of the third barrier 210 is less than a height of a portion, located in the side peripheral area BB1, of the third barrier 210. For example, the portion, located in the side peripheral area BB1, of the third barrier 210 includes five first pad layers 2101, one second pad layer 2102, and one third pad layer 2103. The portion located in the corner peripheral area BB2 includes five first pad layers 2101 and one second pad layer 2102. In this way, the height of the portion, located in the corner peripheral area BB2, of the third barrier 210 is reduced by a thickness of the one third pad layer 2103 compared with the height of the portion, located in the side peripheral area BB1, of the third barrier.

For another example, in the case that the second barrier structure 200 includes at least two third barriers 210, a height of a portion, located in the corner peripheral area BB2, of a third barrier 210 relatively away from the display area AA is less than a height of a portion, located in the side peripheral area BB1, of the third barrier 210; and a height of a portion, located in the corner peripheral area BB2, of a third barrier 210 relatively proximate to the display area AA is less than a height of a portion, located in the side peripheral area BB1, of the third barrier 210.

For example, the portion, located in the side peripheral area BB1, of the third barrier 210 relatively away from the display area AA includes five first pad layers 2101, one second pad layer 2102, and one third pad layer 2103. The portion located in the corner peripheral area BB2 includes five first pad layers 2101 and one second pad layer 2102. In this way, the height of the portion, located in the corner peripheral area BB2, of the third barrier 210 relatively away from the display area AA is reduced by a thickness of the one third pad layer 2103 compared with the height of the portion, located in the side peripheral area BB1, of the third barrier.

Moreover, the portion, located in the side peripheral area BB1, of the third barrier 210 relatively proximate to the display area AA includes four first pad layers 2101, one second pad layer 2102, and one third pad layer 2103. The portion located in the corner peripheral area BB2 includes four first pad layers 2101 and one second pad layer 2102. In this way, the height of the portion, located in the corner peripheral area BB2, of the third barrier 210 relatively proximate to the display area AA is reduced by a thickness of the one third pad layer 2103 compared with the height of the portion, located in the side peripheral area BB1, of the third barrier.

It can be understood that the spacer layer 14 is generally made of an organic material, which has a thickness greater than a thickness of other film layers in the display panel 1100 (except for the planarization layer 1120). For example, a thickness of the spacer layer 14 is in a range of 1.2 mm to 1.5 mm, inclusive. For example, the thickness of the spacer layer 14 is 1.2 mm. That is, a thickness of the third pad layer 2103 is 1.2 mm. In this way, in the case that the corner peripheral area BB2 is bent to the non-display side of the display panel 1100, the thickness of the corner peripheral area BB2 is significantly less than the thickness of the side peripheral area BB1, which is beneficial to reducing the wrinkle degree of the corner peripheral area BB2 and reducing the probability of poor display effect caused by wrinkles generated by bending the corner peripheral area BB2 of the display panel.

In the description of the above embodiments, specific features, structures, materials or characteristics may be combined in a suitable manner in any one or more embodiments or examples.

The foregoing descriptions are merely specific implementation manners of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a display area and a peripheral area surrounding the display area, the peripheral area comprising a plurality of side peripheral areas and a plurality of corner peripheral areas, and two adjacent side peripheral areas being connected to a corner peripheral area therebetween, wherein the display panel comprises:

a substrate;

a first barrier structure disposed in the peripheral area and at least partially surrounding the display area, the first barrier structure is configured to prevent a crack in the peripheral area from extending to the display area, wherein the first barrier structure comprises:

a first portion, located in a side peripheral area and comprising M first barriers extending along the side peripheral area, M being greater than or equal to 2 ($M \geq 2$); and a second portion, located in a corner peripheral area and comprising N second barriers extending along the corner peripheral area, N being greater than or equal to 1 ($N \geq 1$);

wherein M is greater than N ($M > N$); a first dimension of the first portion is greater than a second dimension of the second portion, the first dimension is a dimension of the first portion in a direction perpendicular to an extending direction of the first portion, and the second dimension is a dimension of the second portion in a direction perpendicular to an extending direction of the second portion;

a second barrier structure, disposed between the first barrier structure and the display area and surrounding the display area, the second barrier structure is configured to prevent a material in the display area from overflowing, wherein a third dimension of a portion, located in the side peripheral area, of the second barrier structure is greater than a fourth dimension of a portion, located in the corner peripheral area, of the second barrier structure; and the third dimension is a dimension of the portion, located in the side peripheral area, of the second barrier structure in a direction perpendicular to an extending direction of the portion, and the fourth dimension is a dimension of the portion, located in the corner peripheral area, of the second barrier structure in a direction perpendicular to an extending direction of the portion; and a first insulating stacked layer disposed on the substrate, wherein a surface of the first insulating stacked layer away from the substrate is provided with a plurality of grooves therein, and the plurality of grooves are located in the peripheral area, and at least partially surround the display area; and in a direction away from the display area, the plurality of grooves are sequentially arranged at intervals, wherein portions, located between two adjacent grooves, of the first insulating stacked layer form a first barrier and a second barrier.

2. The display panel according to claim 1, wherein at least one of the N second barriers is connected to at least two of the M first barriers.

3. The display panel according to claim 1, wherein M is equal to 5 (M=5), and N is equal to 2 (N=2); and in a direction away from the display area, an outermost first barrier is connected to an outermost second barrier, and remaining M−1 first barriers are connected to remaining N−1 second barriers.

4. The display panel according to claim 1, wherein the M first barriers are spaced an equal distance apart; and/or N is greater than or equal to 2 (N≥2), and the N second barriers are spaced an equal distance apart; and/or widths of the M first barriers are substantially equal; and/or N is greater than or equal to 2 (N≥2), and widths of the N second barriers are substantially equal.

5. The display panel according to claim 1, wherein the peripheral area further comprises a plurality of transition peripheral areas;

a side peripheral area and a corner peripheral area that are adjacent are connected through a transition peripheral area therebetween; and a junction of the transition peripheral area and the corner peripheral area forms an inward concave shape, and the inward concave shape is sunken towards a direction proximate to the display area.

6. The display panel according to claim 5, wherein a width of the transition peripheral area decreases from an end, connected to the side peripheral area, of the transition peripheral area to an end, connected to the corner peripheral area, of the transition peripheral area; and at least one second barrier of the N second barriers is connected to at least two first barriers of the M first barriers, and junctions of the at least two first barriers and the at least one second barrier are located in the transition peripheral area.

7. The display panel according to claim 1, wherein the first insulating stacked layer comprises a buffer layer, a first gate insulating layer, a second gate insulating layer, an interlayer dielectric layer, and a passivation layer that are sequentially arranged in a direction perpendicular to the substrate and away from the substrate, wherein the grooves penetrate through at least one, relatively away from the substrate, of the buffer layer, the first gate insulating layer, the second gate insulating layer, the interlayer dielectric layer and the passivation layer.

8. The display panel according to claim 1, further comprising:

a filling part, filling the grooves and covering the first barriers and the second barriers;

or further comprising:

a filling part, filling the grooves and covering the first barriers and the second barriers; and a planarization layer, disposed on a side of the first insulating stacked layer away from the substrate, wherein the filling part and the planarization layer are made of a same material and are disposed in a same layer;

or further comprising:

an encapsulation layer, disposed on a side of the first insulating stacked layer away from the substrate and comprising a first inorganic encapsulation layer, an organic encapsulation layer and a second inorganic encapsulation layer that are sequentially arranged in a direction perpendicular to the substrate and away from the substrate, wherein the first inorganic encapsulation layer and the second inorganic encapsulation layer cover the first barrier structure, and an orthographic projection of the organic encapsulation layer on the substrate and an orthographic projection of the first barrier structure on the substrate have a distance therebetween.

9. A display apparatus, comprising the display panel according to claim 1.

10. A display panel having a display area and a peripheral area surrounding the display area, the peripheral area comprising a plurality of side peripheral areas and a plurality of corner peripheral areas, and two adjacent side peripheral areas being connected to a corner peripheral area therebetween, wherein the display panel comprises: a second barrier structure surrounding the display area, and the second barrier structure is configured to prevent a material in the display area from overflowing, wherein a third dimension of a portion, located in a side peripheral area, of the second barrier structure, is greater than a fourth dimension of a portion, located in a corner peripheral area, of the second barrier structure, wherein the third dimension is a dimension of the portion, located in the side peripheral area, of the second barrier structure in a direction perpendicular to an extending direction of the portion, and the fourth dimension is a dimension of the portion, located in the corner peripheral area, of the second barrier structure in a direction perpendicular to an extending direction of the portion; and the second barrier structure in the two adjacent side peripheral areas and the corner peripheral area between the two adjacent side peripheral areas is a continuous structure.

11. The display panel according to claim 10, wherein the second barrier structure comprises at least one third barrier, the at least one third barrier surrounds the display area, wherein in a case that the second barrier structure comprises one third barrier, a width of a portion, located in the side peripheral area, of the third barrier is greater than a width of a portion, located in the corner peripheral area, of the third barrier; and in a case that the second barrier structure comprises at least two third barriers, the at least two third barriers are sequentially arranged at intervals in a direction away from the display area; in the side peripheral area, a distance between two adjacent third barriers is a first distance; in the corner peripheral area, a distance between the two adjacent third barriers is a second distance; and the first distance is greater than the second distance; and/or a width of a portion, located in the side peripheral area, of a third barrier is greater than a width of a portion, located in the corner peripheral area, of the third barrier.

12. The display panel according to claim 11, wherein the third barrier comprises:

a first barrier section extending along the side peripheral area;

a second barrier section extending along the corner peripheral area; and a third barrier section connected between the first barrier section and the second barrier section, wherein a width of the third barrier section decreases from an end, connected to the first barrier section, of the third barrier section to an end, connected to the second barrier section, of the third barrier section.

13. The display panel according to claim 11, further comprising: a substrate, and at least one planarization layer and a pixel defining layer that are sequentially disposed on the substrate, wherein the third barrier comprises at least one first pad layer and a second pad layer that are arranged in a direction perpendicular to the substrate; the at least one first pad layer is located in the at least one planarization layer, and the second pad layer is located in the pixel defining layer.

14. The display panel according to claim 13, wherein the display panel comprises a plurality of planarization layers;

the third barrier comprises:

a first supporting part comprising a plurality of first pad layers, wherein for any two adjacent first pad layers, an orthographic projection of a first pad layer relatively proximate to the substrate on the substrate is within a range of an orthographic projection of a first pad layer relatively away from the substrate on the substrate; and a second supporting part, disposed on a side of the first supporting part away from the substrate and comprising at least one first pad layer and the second pad layer, wherein an orthographic projection of a first pad layer adjacent to the second pad layer on the substrate is within a range of an orthographic projection of the second pad layer on the substrate.

15. The display panel according to claim 14, wherein an orthographic projection of the second supporting part on the substrate is within a range of an orthographic projection of the first supporting part on the substrate; and/or the second barrier structure comprises two third barriers; the two third barriers share the first supporting part, and orthographic projections of second supporting parts of the two third barriers on the substrate are both within a range of an orthographic projection of the first supporting part on the substrate; and/or the second barrier structure comprises two third barriers, a number of first pad layers comprised in a third barrier relatively away from the display area is greater than a number of first pad layers comprised in a third barrier relatively proximate to the display area.

16. The display panel according to claim 14, wherein the display area comprises a transparent display area and a main display area at least partially surrounding the transparent display area;

the display panel further comprises:

first sub-pixels disposed in the transparent display area; and at least one transparent conductive layer, wherein the at least one transparent conductive layer comprises transparent signal lines located in the transparent display area, and the transparent signal lines are electrically connected to the first sub-pixels; and a transparent conductive layer is disposed between two adjacent planarization layers.

17. The display panel according to claim 13, wherein a height of a portion, located in the corner peripheral area, of the third barrier is less than a height of a portion, located in the side peripheral area, of the third barrier; or a height of a portion, located in the corner peripheral area, of the third barrier is less than a height of a portion, located in the side peripheral area, of the third barrier; the display panel further comprises: a spacer layer disposed on a side of the pixel defining layer away from the substrate, wherein the third barrier further comprises a third pad layer, in the side peripheral area, disposed on a side of the second pad layer away from the substrate, and the third pad layer is located in the spacer layer.

18. A display apparatus, comprising the display panel according to claim 10.

* * * * *